US007463057B1

United States Patent
Rahim et al.

(10) Patent No.: US 7,463,057 B1
(45) Date of Patent: Dec. 9, 2008

(54) INTEGRATED CIRCUITS WITH ADJUSTABLE MEMORY ELEMENT POWER SUPPLIES

(75) Inventors: Irfan Rahim, San Jose, CA (US); Jeffrey T. Watt, Palo Alto, CA (US); Yowjuang (Bill) Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 113 days.

(21) Appl. No.: 11/394,033

(22) Filed: Mar. 29, 2006

(51) Int. Cl.
 *G06F 7/38* (2006.01)
 *H03K 19/173* (2006.01)
(52) U.S. Cl. .......................... 326/38; 326/113; 326/39
(58) Field of Classification Search ............. 326/37–41; 713/320–321, 340; 365/226–227
 See application file for complete search history.

(56) References Cited

U.S. PATENT DOCUMENTS

| 5,122,846 | A | 6/1992 | Haken |
| 5,642,315 | A | 6/1997 | Yamaguchi |
| 5,801,551 | A | 9/1998 | Lin |
| 6,025,737 | A | 2/2000 | Patel et al. |
| 6,232,893 | B1 | 5/2001 | Cliff et al. |
| 6,335,893 | B1 * | 1/2002 | Tanaka et al. ............... 365/226 |
| 6,433,585 | B1 | 8/2002 | Patel et al. |
| 6,519,191 | B1 * | 2/2003 | Morishita ............... 365/189.09 |
| 6,724,222 | B2 | 4/2004 | Patel et al. |
| 6,777,978 | B2 | 8/2004 | Hart et al. |
| 6,795,332 | B2 | 9/2004 | Yamaoka et al. |
| 6,897,679 | B2 | 5/2005 | Cliff et al. |
| 7,180,334 | B2 * | 2/2007 | Starr .......................... 327/156 |
| 2005/0280437 | A1 | 12/2005 | Lewis et al. |

OTHER PUBLICATIONS

U.S. Appl. No. 11/335,437, filed Jan. 18, 2006, Liu et al.
U.S. Appl. No. 11/282,437, filed Nov. 17, 2005, Liu et al.
U.S. Appl. No. 11/282,858, filed Nov. 17, 2005, Liu et al.

* cited by examiner

*Primary Examiner*—Vibol Tan
*Assistant Examiner*—Matthew C Tabler
(74) *Attorney, Agent, or Firm*—Treyz Law Group; G. Victor Treyz; David C. Kellogg

(57) ABSTRACT

Integrated circuits such as programmable logic device integrated circuits are provided with adjustable configuration random-access-memory cell power supply circuitry. The adjustable configuration random-access-memory cell power supply circuitry powers configuration random-access-memory cells on an integrated circuit. During operation of the integrated circuit, the configuration random-access-memory cells provide static output signals that turn on and off associated pass transistors. The adjustable power supply circuitry can be configured to produce different power supply voltages on different portions of an integrated circuit. The different power supply voltages accommodate circuit design constraints while minimizing power consumption due to pass transistor leakage.

20 Claims, 21 Drawing Sheets

| CRAM BIT | A | B | T1 | T2 | T3 | T4 | VCCPG | VSSPG |
|---|---|---|---|---|---|---|---|---|
| 0 | 1.6V | 0V | OFF | ON | ON | OFF | 1.6V (VCC1) | 0V (VSS1) |
| 1 | -0.2V | 1.4V | ON | OFF | OFF | ON | 1.4V (VCC2) | -0.2V (VSS2) |

FIG. 11

INTEGRATED CIRCUITS WITH ADJUSTABLE MEMORY ELEMENT POWER SUPPLIES

BACKGROUND

This invention relates to integrated circuits such as programmable logic device integrated circuits, and more particularly, to integrated circuits with memory element power supplies that can be selectively adjusted to reduce power consumption.

Programmable logic devices are a type of integrated circuit that can be programmed by a user to implement a desired custom logic function. In a typical scenario, a logic designer uses computer-aided design tools to design a custom logic circuit. When the design process is complete, the tools generate configuration data files. The configuration data is loaded into memory elements on the programmable logic devices to configure the devices to perform the desired custom logic function.

Programmable logic device memory elements are often based on random-access-memory (RAM) cells. Because the RAM cells are loaded with configuration data during device programming, the RAM cells are sometimes referred to as configuration memory or configuration random-access-memory cells (CRAM).

During normal operation of a programmable logic device, loaded CRAM cells produce static output signals that are applied to the gates of metal-oxide-semiconductor (MOS) field-effect transistors (e.g., pass transistors). The CRAM output signals turn some transistors on and turn other transistors off. This selective activation of certain transistors on the device customizes the operation of the device so that the device performs its intended function.

The performance of modern integrated circuits such as programmable logic devices is often limited by power consumption considerations. Circuits with poor power efficiency place undesirable demands on system designers. Power supply capacity may need to be increased, thermal management issues may need to be addressed, and circuit designs may need to be altered to accommodate inefficient circuitry.

A number of techniques have been proposed for limiting integrated circuit power consumption including substrate biasing, regulation of core logic power supply voltages, use of negative gate voltages, and source side biasing. While these techniques are useful, they do not solve all power consumption problems.

Due to considerations such as reduced power consumption, it is common to operate integrated circuits such as programmable logic devices using multiple power supply levels. Core logic in the interior of an integrated circuit may be powered using a relatively lower power supply voltage called Vcc-core. Input-output circuitry that is used to interface with external system components may be powered using a relatively higher power supply voltage called Vccio. Intermediate power supply levels may also be used.

CRAM cells on a programmable logic device are powered using a positive power supply voltage Vccpg and a ground supply voltage Vsspg. A CRAM cell on a programmable logic device produces an output signal that is high or low depending on the contents loaded into the cell. A CRAM cell that contains a logic one produces a high output signal at the voltage Vccpg. A CRAM cell that contains a logic zero produces a low output signal at the voltage Vsspg.

Due to the operating characteristics of metal-oxide-semiconductor transistors, the values chosen for the CRAM power supply rails Vccpg and Vsspg affect the performance and power consumption of the transistors that are controlled by the CRAM cells. CRAM cells that are powered using relatively low Vccpg voltages such as those used for powering core logic will not turn on their associated pass transistors as fully as they would if a larger voltage were used. This can adversely affect circuit performance, because transistors that are not fully turned on can have difficulties in overcoming parasitic circuit capacitances and other circuit constraints. Because of the impact the values of Vccpg and Vsspg have on circuit performance, it may be desirable to adjust these power supply voltages. However, power supply adjustments should not adversely affect device reliability, performance, or power consumption.

It would therefore be desirable to be able to provide integrated circuits with adjustable CRAM power supplies that allow performance and power consumption to be optimized without compromising reliability.

SUMMARY

In accordance with the present invention, integrated circuits such as programmable logic devices are provided that have configuration random-access-memory cells. During normal operation of an integrated circuit, its configuration random-access-memory cells are loaded with configuration data. Each configuration random-access-memory cell produces a static output signal based on its loaded configuration data. The static output signals are applied to the gates of metal-oxide-semiconductor transistors, thereby selectively turning some of the transistors on and some of the transistors off to customize the integrated circuit.

Leakage currents in the metal-oxide-semiconductor transistor are reduced by using lower voltage static output signals selectively on portions of the integrated circuit that do not require maximum performance. Adjustable configuration random-access-memory power supply circuitry is used to supply different power supply voltages to the configuration random-access-memory cells in different portions of the integrated circuit. Computer-aided design tools are used to generate configuration data for adjusting the settings of the adjustable configuration random-access-memory power supply circuitry.

Reliability constraints dictate that the separation between the upper CRAM power supply rail Vccpg and the lower CRAM power supply rail Vsspg should not exceed a maximum value for a given fabrication process. During adjustments to the CRAM power supply rails, some CRAM cells receive higher values of Vccpg and Vsspg while other CRAM cells receive lower values of Vccpg and Vsspg. To avoid violating reliability constraints, the rail-to-rail voltage separation of all CRAM cells is maintained below the maximum value. With one suitable arrangement, the rail-to-rail voltage separation is fixed, so that Vccpg-Vsspg has the same magnitude across a programmable logic device, regardless of whether a particular CRAM cell is being powered with relatively larger or relatively smaller values of Vccpg and Vsspg. This allows the on/off performance of the programmable transistors that are being controlled by the CRAM cells to be maximized without exceeding the maximum limits on swings in Vgs that are established by the reliability constraints.

Further features of the invention, its nature and various advantages will be more apparent from the accompanying drawings and the following detailed description of the preferred embodiments.

BRIEF DESCRIPTION OF THE DRAWINGS

FIG. 11 is a table showing the impact of loading zero and one bits into the configuration random-access-memory cell used to adjust the adjustable power supply of FIG. 10 in accordance with the present invention.

DETAILED DESCRIPTION

Figure 1:
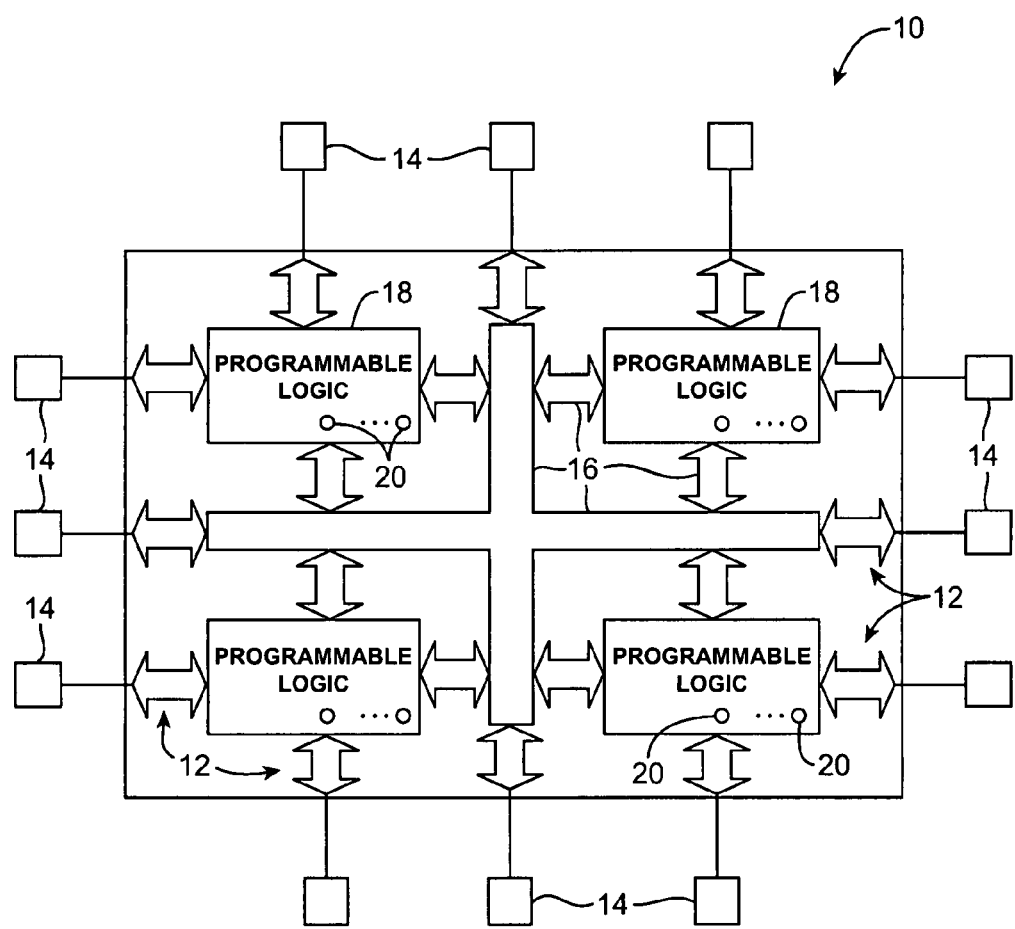
FIG. 1 is a diagram of an illustrative programmable logic device in accordance with the present invention.

The present invention relates to integrated circuits containing memory elements. The memory elements are preferably volatile memory elements such as random-access-memory cells. The integrated circuits may be memory chips, digital signal processing circuits, microprocessors, application specific integrated circuits, programmable logic device integrated circuits, or any other suitable integrated circuit. The present invention will generally be described in the context of programmable logic device integrated circuits and programmable logic device memory elements that are loaded with configuration data as an example.

In accordance with the present invention, the power supply levels used for powering memory elements in different regions of an integrated circuit may be set at different levels. For example, some memory elements may be powered using positive and ground power supply voltages of 1.6 volts and 0 volts, respectively, whereas other memory elements may be powered using positive and ground power supply voltages of 1.4 volts and −0.2 volts, respectively.

The memory elements that are powered with the larger power supply settings (1.6 volts and 0 volts in this example) will be able to turn on their associated pass transistors more fully than the memory elements that are powered with the lower power supply settings (1.4 volts and −0.2 volts in this example). This is because a 1.6 volt memory element output signal will turn on an n-channel metal-oxide-semiconductor pass transistor more fully than a 1.4 volt memory element output signal. The circuitry that is provided with the larger memory element power supply settings is therefore faster than the circuitry operated with the lower memory element power supply settings. The circuitry that is powered with the lower memory element power supply settings operates more slowly, but consumes less power (i.e., because the leakage current of a pass transistor that is turned off using a −0.2 volt gate control signal is less than the leakage current of a pass transistor that is turned off using a 0 volt gate control signal).

By adjusting the memory element power supply settings on the integrated circuit, some circuit regions may be placed in fast mode, whereas other circuit regions may be placed in slow mode. The fast mode regions may be used to ensure that a user's desired timing constraints are met. For example, the regions of a programmable logic device that are used to handle critical circuit paths may be placed in fast mode, to ensure maximum performance. The slow mode regions may be used to reduce power consumption due to pass transistor leakage whenever maximum performance is not required.

There may be any suitable number of memory element power supply settings. For example, there may be a fast mode, a medium-speed mode, and a slow mode. Adjustable memory element power supply architectures that support four or more different speed and power consumption settings may also be used. If desired, circuitry that is not used may be placed in sleep mode by powering various associated memory elements using particularly low voltages and, if desired, by loading appropriate "sleep" configuration data into these memory elements. Computer-aided design tools may be used to facilitate selection of optimum memory element power supply settings.

An illustrative programmable logic device 10 in accordance with the present invention is shown in FIG. 1. Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers and logic array blocks (LABs).

When a memory element supplies a high output to an NMOS pass transistor, the transistor is turned on and passes logic signals from its input to its output. When the memory element output is low, the pass transistor is turned off and does not pass logic signals. Being able to configure pass transistors in this way allows the logic of the programmable logic device to be programmed to implement a desired logic design.

A typical memory element 20 is formed from a number of transistors configured to form cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are typically random-access-memory (RAM) elements. As a result, these programmable logic device memory elements are sometimes referred to as configuration random-access-memory (CRAM) cells. Other terms that are sometimes used to refer to memory elements 20 include terms such as memory cells, static random-access-memory elements or cells, RAM cells, RAM elements, CRAM cells, configuration elements, volatile memory elements, configuration bits, etc. In a typical modern programmable logic device, there may be millions of memory elements 20 on each chip.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
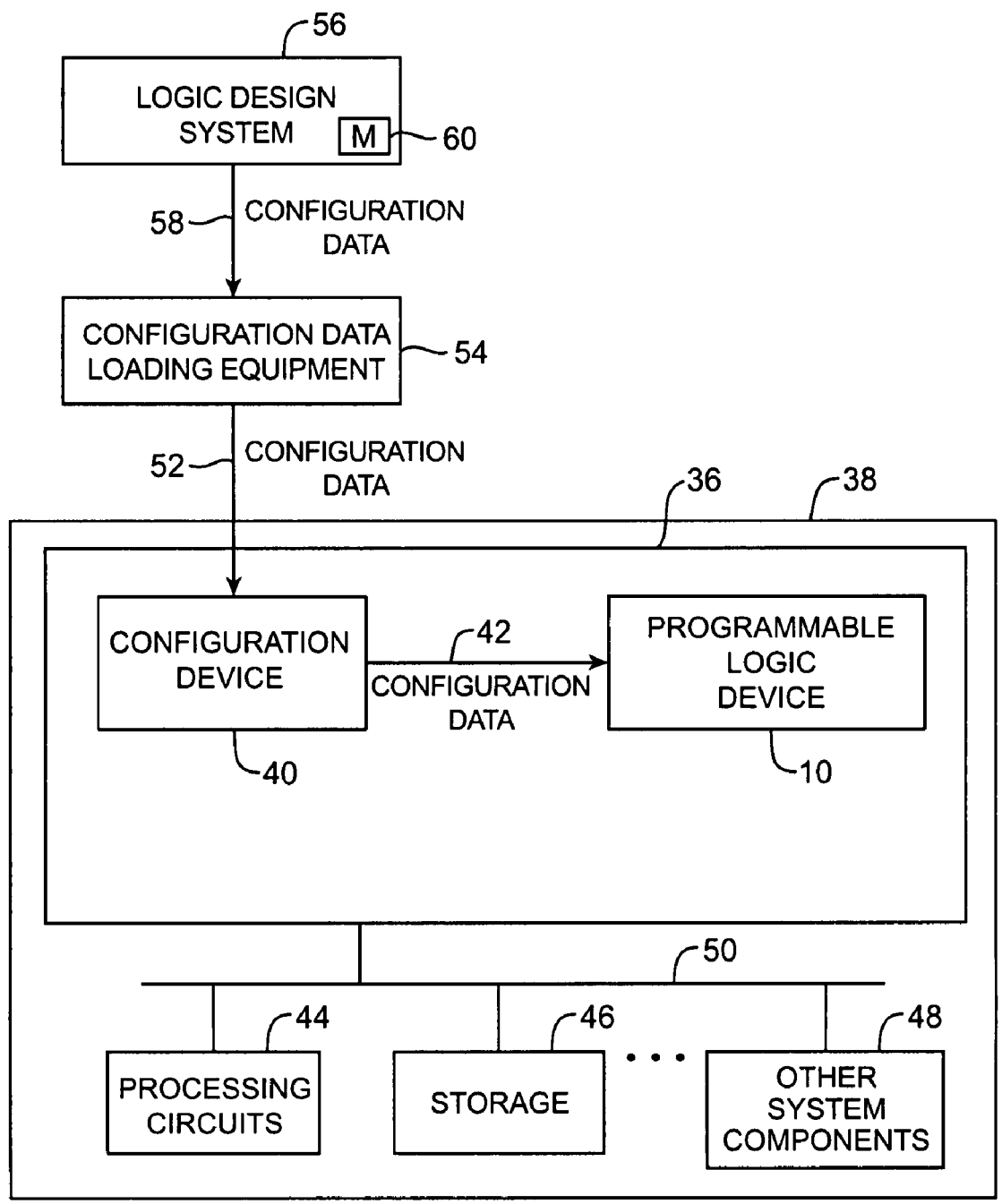
FIG. 2 is a diagram showing how programmable logic device configuration data is created by a logic design system and loaded into a programmable logic device to configure the device for operation in a system in accordance with the present invention.

An illustrative system environment for a programmable logic device 10 is shown in FIG. 2. Programmable logic device 10 may be mounted on a board 36 in a system 38. In general, programmable logic device 10 may receive programming data from programming equipment or from any other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. The circuit 40 may be an erasable-programmable read-only memory (EPROM) chip, a programmable logic device configuration data loading chip with built-in memory (sometimes referred to as a configuration device), or any other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42.

Logic circuit design system 56 includes processing circuitry and storage 60. In supporting design operations involved in implementing a desired custom logic function, the logic design system 56 uses software implemented using circuitry and storage 60 to make circuit resource assignments and placement decisions that minimize pass transistor power consumption.

Figure 3:
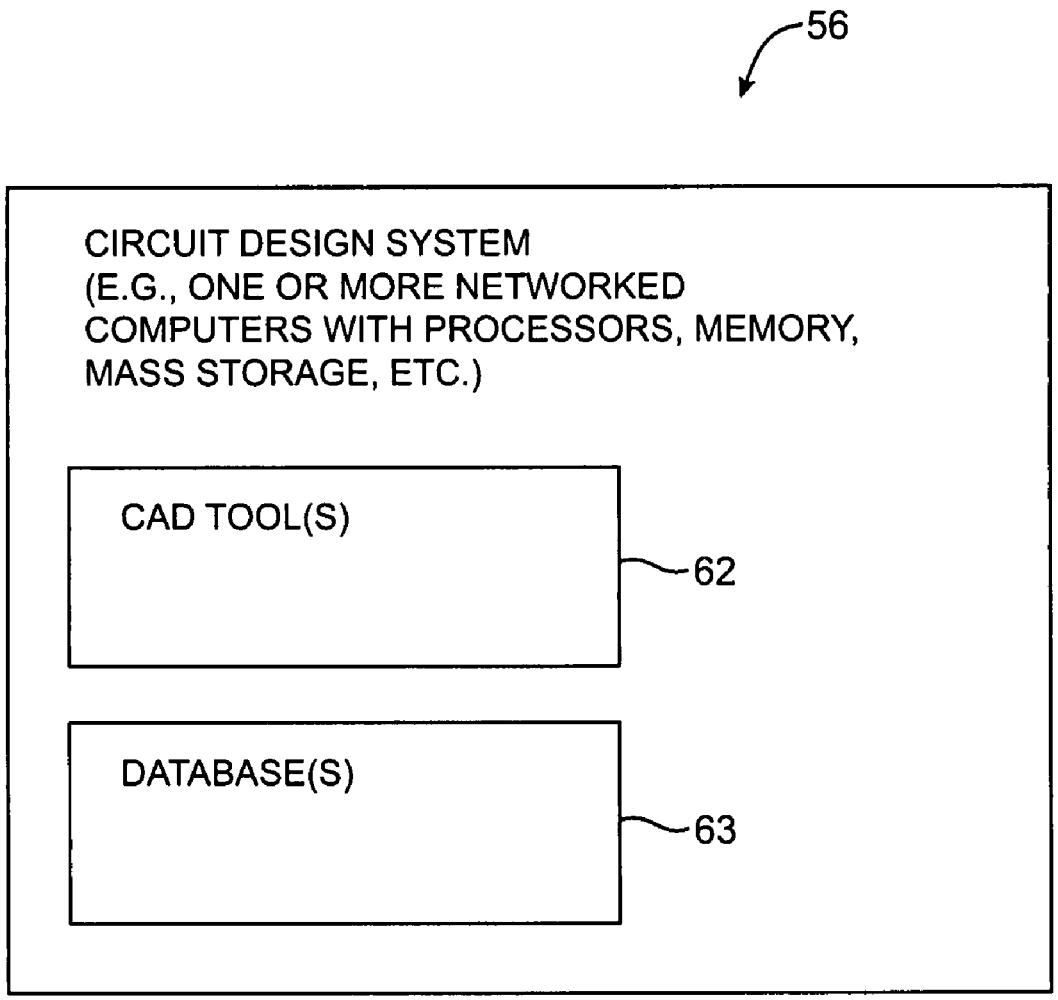
FIG. 3 is a diagram of a circuit design system that may be used to generate configuration data for implementing custom circuit designs in programmable logic devices in accordance with the present invention.

An illustrative circuit design system 56 in accordance with the present invention is shown in FIG. 3. System 56 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 62 and databases 63 reside on system 56. During operation, executable software such as the software of computer aided design tools 62 runs on the processor(s) of system 56. Databases 63 are used to store data for the operation of system 56. In general, software and data may be stored on any computer-readable medium (storage) in system 56. Such storage, which is shown schematically as storage 60 of FIG. 2, may include computer memory chips, removable and fixed media such as hard disk drives, flash memory, compact discs (CDs), DVDs, other optical media, and floppy diskettes, tapes, or any other suitable memory or storage device(s). When the software of system 56 is installed, the storage 60 of system 56 has instructions and data that cause the computing equipment in system 56 to execute various methods (processes). When performing these processes, the computing equipment is configured to implement the functions of the circuit design system.

The computer aided design (CAD) tools 62, some or all of which are sometimes referred to collectively as a CAD tool, may be provided by a single vendor or multiple vendors. Tools 62 may be provided as one or more suites of tools (e.g., a compiler suite for performing tasks associated with implementing a circuit design in a programmable logic device) and/or as one or more separate software components (tools). Database(s) 63 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

When a logic designer uses tools 62 to implement a circuit, the logic designer is faced with a number of potentially challenging design decisions. The designer must balance factors such as cost, size, and performance to create a workable end product. Tradeoffs are involved. For example, a circuit of a given design can be implemented so that it operates quickly, but consumes a large amount of power and on-chip resources or can be implemented so that is operates more slowly, while consuming less power and fewer resources.

In accordance with the present invention, power consumption can be reduced in selected portions of a programmable logic device integrated circuit by selectively adjusting the power supply voltages used to power configuration random-access-memory in different portions of the device. A logic designer can use a tool or tools 62 to make resource selections, placement decisions, and configuration random-access-memory element power supply adjustments to minimize power consumption while satisfying design constraints such as desired timing margins. For clarity, the power consumption minimization functions of the invention are generally described in the context of logic design system 56 and CAD tools 62. In general, any suitable number of software components (e.g., one or more tools) may be used to provide a circuit designer with power consumption reduction assistance. These software components may be separate from logic compilers, place-and-route tools and other software in tools 62 or some or all of the software components that provide power consumption reduction assistance functionality may be provided within logic synthesis and optimization tools, a place-and-route tool, etc.

Figure 4:
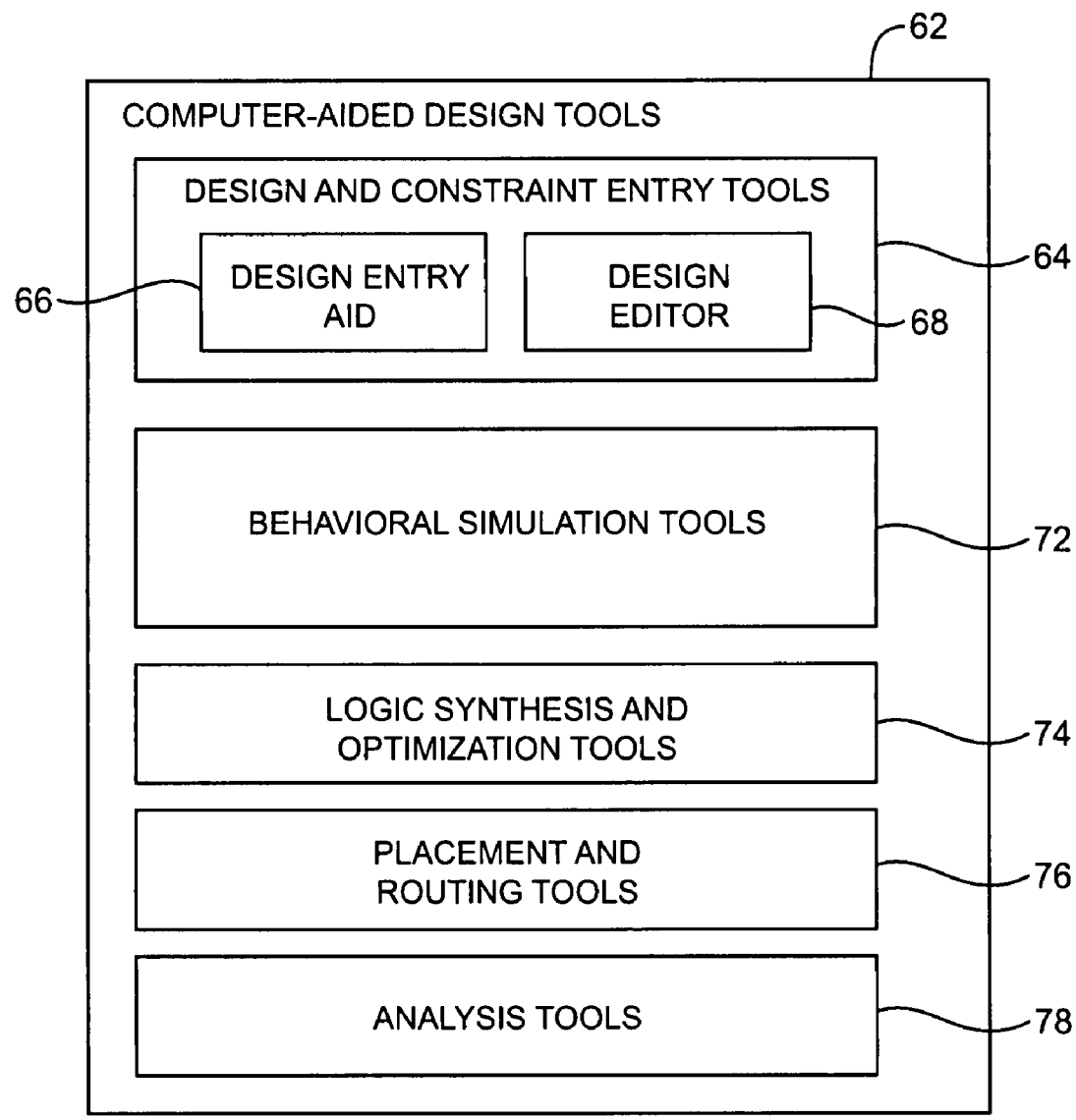
FIG. 4 is a diagram of illustrative computer-aided design (CAD) tools that may be used in a logic design system in accordance with the present invention.

Illustrative computer aided design tools 62 that may be used in a logic design system such as system 56 of FIGS. 2 and 3 are shown in FIG. 4.

The design process typically starts with the formulation of logic circuit functional specifications. A logic designer can specify how a desired circuit should function using design and constraint entry tools 64. Design and constraint entry tools 64 may include tools such as design and constraint entry aid 66 and design editor 68. Design and constraint entry aids such as aid 66 may be used to help a logic designer locate a desired design from a library of existing logic designs and may provide computer-aided assistance to the logic designer for entering (specifying) the desired design. As an example, design and constraint entry aid 66 may be used to present screens of options for a user. The user may click on on-screen options to select whether the circuit being designed should have certain features. Design editor 68 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 64 may be used to allow a logic designer to provide a desired logic design using any suitable format. For example, design and constraint entry tools 64 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 64 may allow the logic designer to provide a logic design to the logic design system 10 using a hardware description language such as Verilog hardware description language (HDL) or Very High Speed Integrated Circuit Hardware Description Language (VHDL). The designer of the logic circuit can enter the logic design by writing hardware description language code with editor 68. Blocks of code may be imported from user-maintained or commercial libraries if desired.

After the design has been entered using design and constraint entry tools 64, behavioral simulation tools 72 may be used to simulate the functional performance of the design. If the functional performance of the design is incomplete or incorrect, the logic designer can make changes to the design using design and constraint entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.).

Once the functional operation of the logic design has been determined to be satisfactory, logic synthesis and optimization tools 74 may be used to implement the logic design in a particular programmable logic device (i.e., in the logic and interconnect resources of a particular programmable logic device product or product family).

Tools 74 attempt to optimize the design by making appropriate selections of hardware to implement different logic functions in the logic design based on the logic design data and constraint data entered by the logic designer using tools 64.

After logic synthesis and optimization using tools 74, the logic design system may use tools such as placement and routing tools 76 to perform physical design steps (layout synthesis operations). Placement and routing tools 76 are used to determine how to place the circuits for each logic function within the programmable logic device. For example, if two counters interact with each other, the placement and routing tools 76 may locate these counters in adjacent logic regions on the programmable logic device to minimize interconnect delays. The placement and routing tools 76 create orderly and efficient implementations of logic designs for a given programmable logic device.

Tools such as tools 74 and 76 may be part of a compiler suite (e.g., part of a suite of compiler tools provided by a programmable logic device vendor). In accordance with the present invention, tools such as tools 74 and 76 manually and automatically take into account the effects of using different configuration random-access-memory cell power supply levels in different regions of a device while implementing a desired circuit design. This allows tools 74 and 76 to minimize power consumption (e.g., power consumption due to pass transistor leakage currents) while satisfying design constraints.

After an implementation of the desired logic design in the programmable logic device has been generated using placement and routing tools 76, the implementation of the design may be analyzed and tested using analysis tools 78. After satisfactory optimization operations have been completed using tools 62, tools 62 can produce the configuration data for the programmable logic device.

Figure 5:
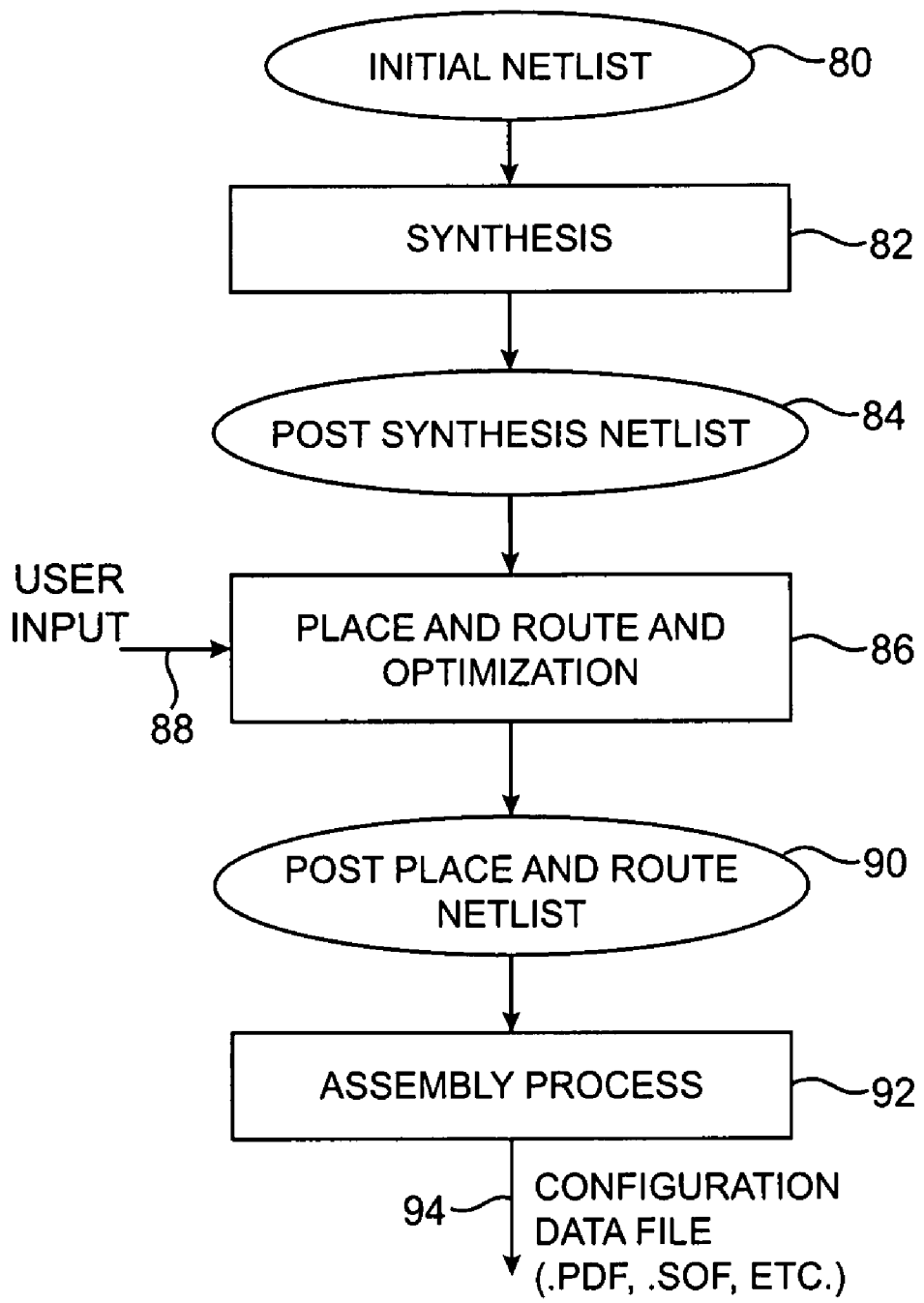
FIG. 5 is a flow chart of illustrative steps involved in designing a custom logic circuit and producing configuration data for that circuit in accordance with the present invention.

Illustrative operations involved in using tools 62 of FIG. 4 to produce configuration data files are shown in FIG. 5. As shown in FIG. 5, an initial netlist 80 is synthesized at step 82 to produce a post-synthesis netlist 84. At step 86, user input 88 and the post synthesis netlist 84 are processed during place and route and optimization operations. During the operations of step 86, the CAD tools 62 take account of the effects of using different configuration random-access-memory cell power supply levels in different portions of the device and, through appropriate selection of memory cell power supply levels, circuit resource assignments, and placement decisions, tools 62 reduce power consumption while satisfying design constraints. The resulting netlist 90 is processed further during an assembly process 92 to produce a configuration data file output 94 (e.g., a .pof or .sof file).

CAD tools 62 can automatically identify appropriate configuration random-access-memory cell power supply levels (e.g., one or more minimum acceptable random-access-memory cell power supply levels) that allow the logic designer's circuit to function as desired. If desired, manual configuration random-access-memory cell power supply settings may be supplied by the logic designer.

Configuration random-access-memory cell power supply settings can be implemented using any suitable level of granularity. With high-granularity architectures, highly-localized adjustments may be made. As an example, adjustments may be made on a multiplexer-by-multiplexer basis. With this type of arrangement, the memory cells in each multiplexer are grouped together and are powered using a common memory cell power supply level. Some multiplexers are operated in fast mode and other multiplexers are operated in slow (low-power) mode. As another example, adjustments may be made on a logic-array-block (LAB) basis. With this type of arrangement, the memory cells in some LABs may be powered using higher voltages whereas the memory cells in other LABs may be powered using lower voltages. More granular architectures allow for greater design flexibility, but may require a relatively larger amount of resource overhead. Less granular architectures will tend to be less complex at the expense of reduced flexibility.

Figure 6:
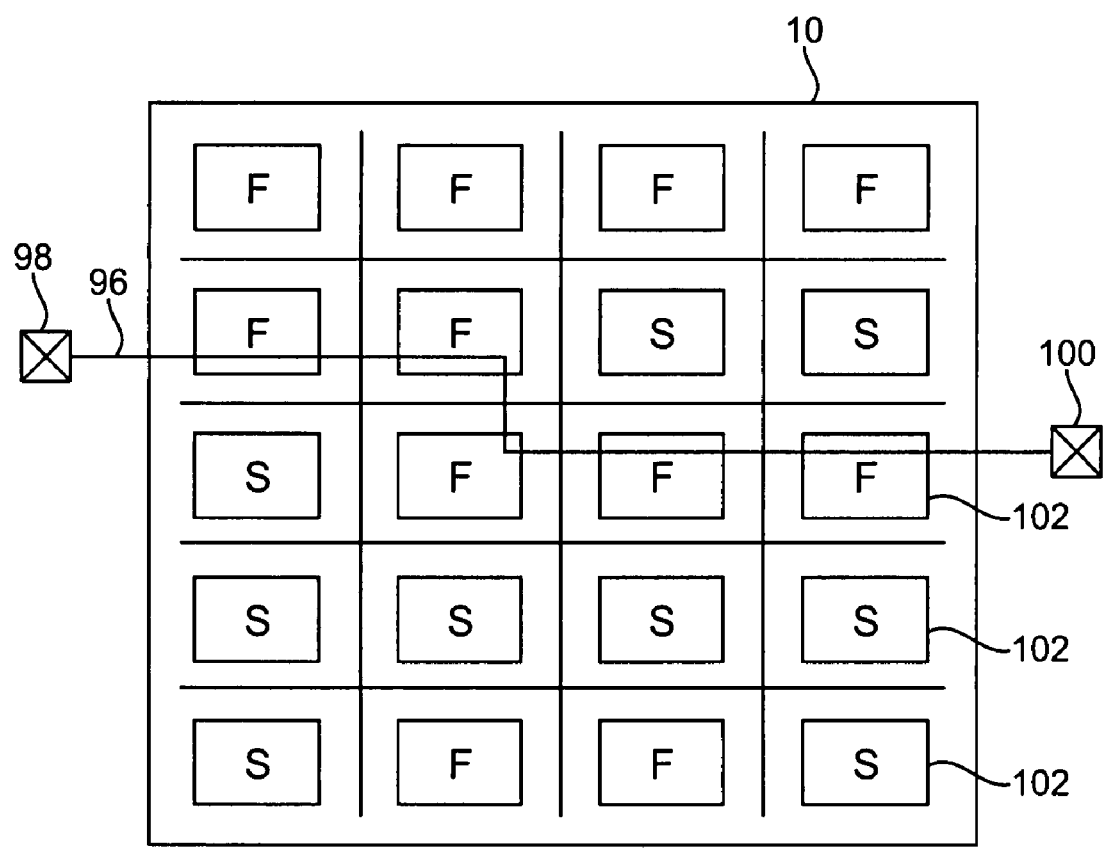
FIG. 6 is a diagram of an integrated circuit showing how different areas on the circuit may be configured to operate in different modes by selectively adjusting their configuration-random-access-memory cell power supply levels in accordance with the present invention.

An illustrative programmable logic device integrated circuit that contains adjustable memory cell power supplies is shown in FIG. 6. In the example of FIG. 6, a logic designer's desired custom circuit design contains a critical path 96. Signals on path 96 must flow from input 98 to output 100 as fast as possible.

The circuit 10 of FIG. 6 contains rows and columns of logic blocks 102. Some of the logic blocks 102 contain memory cells that are powered using relatively higher power supply settings (e.g., 1.6 volts and 0 volts). These blocks are labeled "F" to indicate that their circuitry operates relatively rapidly (fast mode). Other blocks 102 contain memory cells that are powered using relatively lower voltages (e.g., 1.4 volts and −0.2 volts). These blocks operate in a lower-power slower speed regime and are therefore labeled "S" to indicate that their circuitry operates relatively slower (slow mode).

To ensure that the signals on critical path 96 are not unnecessarily slowed by low-power, low-speed circuitry, the memory cell power supply settings are adjusted so that path 96 only traverses regions of circuitry that are operating in fast mode (the "F" blocks in FIG. 6). Path 96 avoids the slow blocks S. To reduce power consumption on circuit 10 as much as possible while satisfying the timing constraints associated with the logic designer's custom circuit, many of the blocks 102 that do not contain path 96 are placed in slow mode.

The example of FIG. 6 is simplified. In general, there are thousands or millions of signal paths on a given programmable logic device. Each of these signal paths has associated timing constraints. To reduce power consumption while satisfying performance criteria, the logic design system 56 is used to help determine which regions of circuitry should be placed in slow mode and which regions of circuitry should be placed in fast mode.

Figure 7:
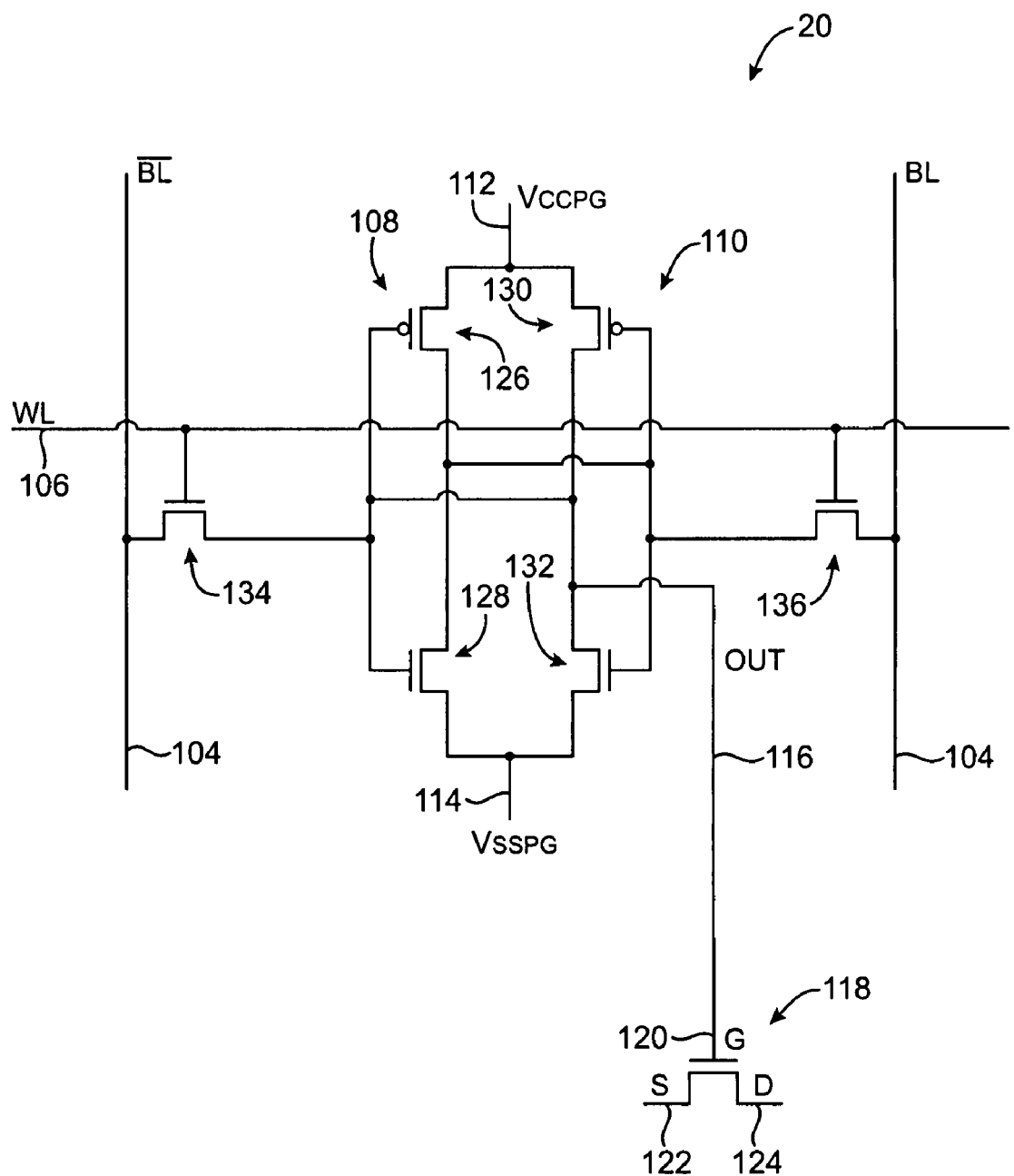
FIG. 7 is a diagram of an illustrative programmable logic device integrated circuit configuration random-access-memory cell in accordance with the present invention.

The circuitry of an illustrative configuration random-access-memory cell 20 is shown in FIG. 7. The example of FIG. 7 uses a dual-bit-line arrangement. This is merely illustrative. In general, the configuration random-access-memory cells 20 on programmable logic device 10 may be formed using any suitable architecture. The use of a dual-bit-line arrangement is shown as an example.

As shown in FIG. 7, cell 20 contains two cross-coupled inverters 108 and 110. Inverter 108 contains p-channel metal-oxide-semiconductor transistor 126 and n-channel metal-oxide-semiconductor transistor 128. Inverter 110 contains p-channel metal-oxide-semiconductor transistor 130 and n-channel metal-oxide-semiconductor transistor 132. Once loaded with configuration data, cell 20 produces an output signal. The output signal from cell 20 is provided on output 116 and is conveyed to input 120 (the gate G) of n-channel pass transistor 118.

The output signal from cell 20 controls the operation of transistor 118. If the output is high, transistor 118 will be turned on and signals can pass between the source S (terminal 122) and the drain D (terminal 124) of transistor 118. If the output on line 116 is low, transistor 118 is turned off and the source and drain of transistor 118 are electrically isolated from each other. The source and drain terminals S and D of transistors 118 are sometimes collectively referred to as source-drain terminals.

Cells such as cell 20 are arranged in an array on device 10. In a typical arrangement, there are thousands or millions of cells 20 on a given programmable logic device 10. The cells 20 in the array form rows and columns. Bit lines 104 and word lines 106 are used to control read and write operations for the cells 20. Bit lines 104 extend along columns of cells 20 in the array. Word lines control rows of cells 20 in the array.

Bit lines 104 are connected to the source-drain terminals of transistors 134 and 136. Word lines 106 are connected to the gates of transistors 134 and 136 and turn transistors 134 and 136 off and on as needed. During read operations, read/write control circuitry asserts a desired word line 106 while bit lines 104 are monitored to sense appropriate memory cell contents. During write operations, a word line is asserted while configuration data is strongly driven onto the appropriate bit lines. Write operations are used to load configuration data into cells 20. Read operations are used to confirm that configuration data has been properly stored.

Memory cell 20 is powered using a positive power supply voltage Vccpg and a ground power supply voltage Vsspg. The positive power supply voltage Vccpg is applied to terminal 112. The ground power supply voltage Vsspg is applied to terminal 114. The magnitude of the cell output signal that is provided on line 116 is a function of the data bit value stored in the cell 20 and the power supply voltages Vccpg and Vsspg. As an example, consider a cell 20 in which a logic one has been stored. If this cell is powered using a positive power supply voltage Vccpg of 1.6 volts, the output signal on line 116 will be 1.6 volts. If, however, the same cell is powered using voltage Vccpg of 1.4 volts, the output signal voltage will be 1.4 volts. Cells loaded with zeros behave similarly. If a cell containing a zero is powered using a Vsspg level of 0 volts, the cell output will be 0 volts. If a cell containing a zero is powered using a Vsspg level of −0.2 volts, the cell output will be −0.2 volts.

Figure 8:
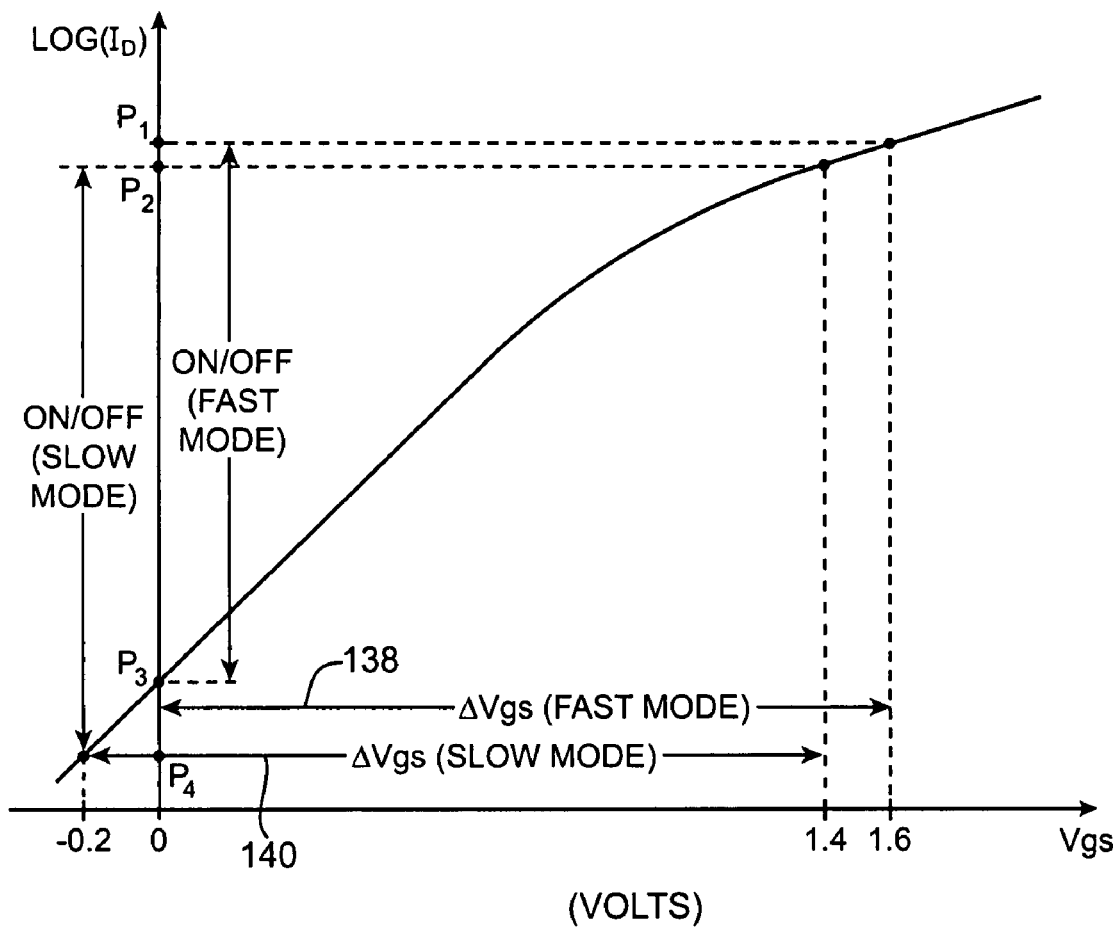
FIG. 8 is a graph that shows the amount of drain current that flows through a pass transistor as a function of applied gate voltage and that shows the impact of using different power supply settings for the configuration random-access-memory cell that controls the pass transistor in accordance with the present invention.

The value of the cell output signal on line 116 affects the performance of the associated transistor that the cell is controlling (i.e., n-channel pass transistor 118 in the example of FIG. 7). The graph of FIG. 8 shows the impact of using different CRAM power supply settings on the performance of transistor 118. In the FIG. 8 graph, the logarithm of the drain-source current log(Id) for transistor 118 is plotted as a function of applied voltage on gate G (i.e., as a function of gate-to-source voltage Vgs). If the gate voltage is 1.6 volts, the transistor 118 operates at point P1. If the gate voltage is 1.4 volts, the transistor operates at point P2. Gate voltages of 0 volts and −0.2 volts cause the transistor 118 to operate at points P3 and P4, respectively.

The on/off performance of transistor 118 is given by the ratio of the on current of the transistor to its off current. As shown in FIG. 8, the on/off performance of the transistor 118 when operating with control voltages of 1.6 volts and 0 volts is given by the ratio of point $P_1$ to point $P_3$. This on/off ratio is obtained when the cell associated with transistor 118 is powered using Vccpg and Vsspg voltages of 1.6 volts and 0 volts, respectively. The on/off performance of the transistor 118 when operating with control voltages of 1.4 volts and −0.2 volts is given by the ratio of point $P_2$ to point $P_4$. This on/off ratio is obtained when the associated cell 20 is powered using Vccpg and Vsspg voltages of 1.4 volts and −0.2 volts, respectively.

Because the Vccpg level of 1.6 volts is larger than typical core logic power supply voltages (which are generally about 1.2 volts), the use of the 1.6 volt Vccpg level is said to be an "overdrive" voltage. The use of the overdrive voltage to turn on transistor 118 helps to reduce the resistance of transistor 118. Because Id is large in this situation, the transistor 118 is capable of rapidly charging parasitic capacitances and helps the programmable logic of which it is a part to operate at high speed. The Vccpg and Vsspg settings of 1.6 volts and 0 volts are therefore said to be "fast mode" settings. The range of gate voltages used for transistor 118 in fast mode is shown by line 138.

When the lower range of gate voltages is used, the gate voltages for the transistor 118 fall within the limits shown by line 140. Vccpg in this scenario is 1.4 volts, which helps to overdrive the transistor 118, although not as strongly as when a Vccpg value of 1.6 volts is used. Vsspg is −0.2 volts, which helps to strongly turn off transistor 118 when the cell contents is a logic zero. The leakage current of transistor 118 is strongly dependent on the gate voltage. Using a gate voltage of −0.2 volts rather than a gate voltage of 0 volts therefore significantly reduces the leakage current of transistor 118 when transistor 118 is turned off. Typically, leakage current is reduced by an order of magnitude for each 100 mV of gate voltage reduction in subthreshold operation (i.e., where Vgs<Vt, the transistor's threshold voltage). Values of Vt are generally on the order of 300 mV. The strong reduction in leakage current continues to be obtained when Vgs is less than 0 V. Because leakage current causes undesired power consumption, reducing the memory cell power supply voltage from 0 volts to −0.2 volts significantly reduces the leakage-current-induced power losses in the pass transistor 118.

It is desirable to operate transistors such as transistor 118 with as wide a range of gate voltages Vgs as possible, as this produces maximum on/off current ratios. The semiconductor manufacturing process used to fabricate programmable logic device 10 governs the maximum gate voltage window (operating range) that is permissible. Gate oxides (insulators) of a certain thickness can withstand a given voltage level. Larger voltages will damage the cells.

One way to maximize the on/off current ratio for the transistors 118 is to use thick gate oxides for pass transistors such as transistor 118. With one suitable arrangement, the thicknesses of the gate oxides of the pass transistors on device 10 are larger than the thicknesses for the gate oxides of other transistors. The pass transistors may have thick oxides and the regular (non-pass-transistor) complementary metal-oxide-semiconductor (CMOS) circuitry on device 10 may have thin oxides. The thicknesses used for the thick and thin oxides may be selected based on the semiconductor fabrication process that is used during manufacturing. As an example, the thin oxides may be 2-3 nm thick and the thick oxides may be 3-5 nm thick. With another suitable arrangement, both the regular CMOS transistors and the pass transistors may be fabricated using thick gate oxides (e.g., to reduce mask complexity).

The on/off current ratios for the fast and slow modes can also be maximized by using the same gate voltage window size for both the fast mode and the slow mode. This arrangement is shown in FIG. 8. The range of permissible gate voltages in fast mode is 1.6 volts (i.e., the Vccpg value of 1.6 volts minus the Vsspg value of 0 volts), as shown by line 138. The range of permissible gate voltages in slow mode is also 1.6 volts (i.e., the Vccpg value of 1.4 volts minus the Vsspg value of −0.2 volts), as shown by line 140. By fixing the separation between the positive and negative power supply rails for the different normal operating modes (i.e., modes such as fast, medium, slow), the pass transistor 118 will exhibit maximum on/off ratios without violating maximum rail-to-rail separation limits imposed by reliability constraints. If desired, the Vccpg to Vsspg separation may be permitted to vary slightly between operating modes, but this will generally produce suboptimal performance, because the operating mode in which the lowest Vccpg to Vsspg separation is used will exhibit a reduced on/off current ratio for transistor 118. By controlling programmable pass transistors in different parts of a programmable logic device with different voltage levels, power consumption and performance can be simultaneously improved without exceeding the maximum Vccpg to Vsspg separation limits imposed by reliability concerns.

Figure 9:
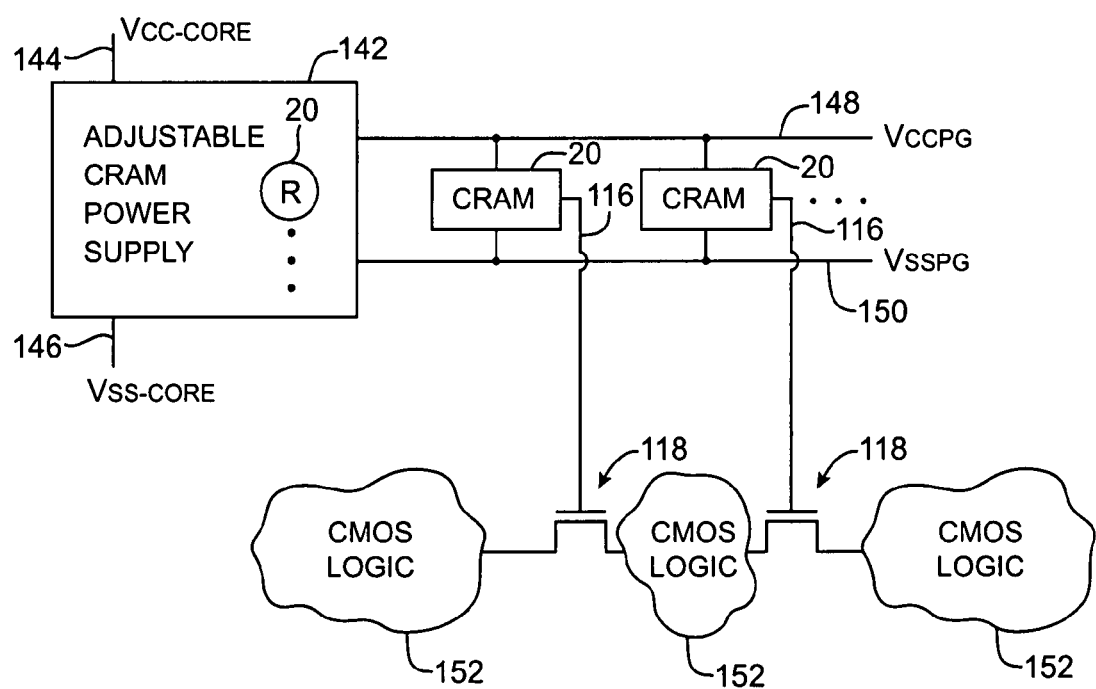
FIG. 9 is a diagram of illustrative circuitry on an integrated circuit that includes an adjustable configuration random-access-memory cell power supply in accordance with the present invention.

Any suitable adjustable memory cell power supply circuitry may be used to produce the adjustable values of Vccpg and Vsspg. An illustrative arrangement is shown in FIG. 9. As shown in FIG. 9, an adjustable CRAM power supply 142 may be powered by power supply voltages such as Vcc-core (e.g., 1.2 volts) and Vss-core (e.g., 0 volts). Positive core logic power supply voltage Vcc-core may be provided to power supply 142 at terminal 144. Ground core logic power supply voltage Vss-core may be provided to power supply 142 at terminal 146. The adjustable CRAM power supply 142 may contain one or more configuration random-access-memory cells 20. By adjusting the configuration data loaded into these CRAM cells, the Vccpg and Vsspg settings of the power supply 142 may be adjusted.

Adjustable CRAM power supply 142 supplies the positive CRAM power supply signal Vccpg to positive power supply distribution path 148. Power supply 142 also supplies the ground CRAM power supply signal Vsspg to ground power supply distribution path 150. The power supply signals Vccpg and Vsspg represent the upper and lower voltages used for powering a group of associated CRAM cells 20. Lines 148 and 150 and their associated voltages Vccpg and Vsspg are sometimes referred to as the power supply rails for the CRAM cells. As described in connection with FIG. 8, the separation between the CRAM power supply rails is preferably fixed. In the present example, the separation between rails is fixed at 1.6 volts, but this is merely illustrative. Any suitable power supply rail separation may be used.

The outputs 116 of the CRAM cells are provided to the gates of pass transistors 118. As shown in FIG. 9, pass transistors 118 receive signals from CMOS logic 152 and provide signals to CMOS logic 152. CMOS logic 152 typically operates at the core power supply voltages of Vcc-core and Vss-core, so the signals on the drain-source terminals of the pass transistors 118 range between Vss-core (e.g., 0 volts) and Vcc-core (e.g., 1.2 volts).

There may be any suitable number of CRAM cells associated with a given set of memory cell power distribution paths 148 and 150. For example, there may be 18 associated CRAM cells 20 if power supply 142 and paths 148 and 150 are being used in an 18-cell multiplexer. As another example, there may be 10s, 100s, or 1000s of cells 20 that are powered by the same set of paths 148 and 150 (e.g., when adjustable CRAM power supply 142 is being used to power the CRAM cells 20 in a logic array block or other large region of programmable logic). Because each adjustable CRAM power supply can be loaded with separate configuration data, the voltages applied to each associated set of paths 148 and 150 and each associated set of CRAM cells can be adjusted independently. This allows a programmable logic device 10 to be configured so that different regions of circuitry operate with different CRAM power supply settings, as described in connection with FIG. 6.

Figure 10:
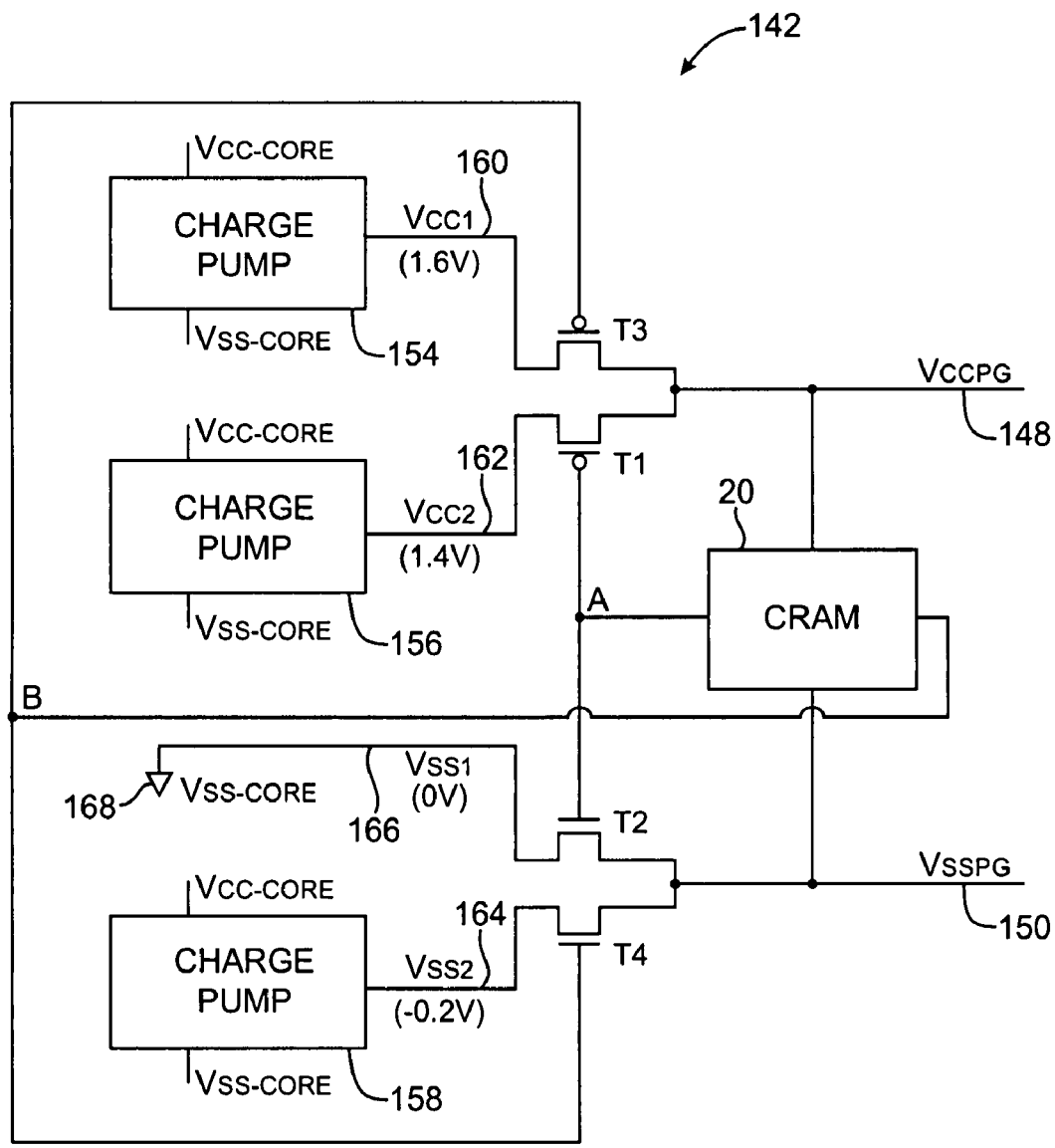
FIG. 10 is a diagram of an illustrative adjustable configuration random-access-memory cell power supply in accordance with the present invention.

Any suitable circuitry may be used for adjustable CRAM power supply 142. One suitable arrangement is shown in the example of FIG. 10. In the example of FIG. 10, adjustable CRAM power supply 142 is capable of being placed in one of two modes (i.e., fast or slow). In other arrangements (not shown in FIG. 10), the adjustable CRAM power supply can be placed in one of more than two modes. The two-mode example of FIG. 10 is merely illustrative.

As shown in FIG. 10, adjustable CRAM power supply 142 has charge pumps 154, 156, and 158, which are used to generate various voltage levels for the upper and lower power supply rails. Charge pumps 154, 156, and 158 may be powered using any suitable power supply voltages that are available on the programmable logic device 10. In general, it is desirable to use power supply voltages that are already available, as this reduces circuit complexity. In the example of FIG. 10, charge pumps 154, 156, and 158 are powered using core power supply voltages Vcc-core and Vss-core.

The output of charge pump 154 is Vcc1 (e.g., 1.6 volts) and is provide on line 160. Line 162 is provided with the signal Vcc2 (e.g., 1.4 volts) by charge pump 156. Charge pump 158 provides Vss2 (−0.2 volts) to line 164. Line 166 is connected to a source 168 of ground potential at 0 volts (Vss-core).

P-channel transistors T1 and T3 are connected to lines 162 and 160, respectively. When transistor T1 is turned on and transistor T3 is turned off, the voltage Vcc2 is provided to path 148 and is used as the upper rail for the adjustable power supply 142. When transistor T3 is turned on and transistor T1 is turned off, the voltage Vcc1 is applied to path 148. By controlling transistors T1 and T3, the positive power supply voltage Vccpg can be adjusted between Vcc1 and Vcc2.

Transistors T2 and T4 are used to select the lower rail voltage Vsspg. Turning transistor T2 on and transistor T4 off takes Vsspg to Vss1 (0 volts). Turning transistor T2 off and transistor T4 on takes Vsspg to Vss2 (−0.2 volts).

The state of the CRAM cell 20 controls the values Vccpg and Vsspg, as shown in the table of FIG. 11.

The voltage on node A controls the pair of transistors T1 and T2. The voltage on node B controls the pair of transistors T3 and T4. If a logic zero is loaded into CRAM cell 20 of FIG. 10, node A is taken to 1.6 volts and node B is taken to 0 volts. The high voltage on node A turns transistor T2 on and turns transistor T1 off. The low voltage on node B turns transistor T3 on and turns transistor T4 off. Under these conditions, the adjustable CRAM power supply is in fast mode and the voltage Vccpg and Vsspg are Vcc1 (1.6 volts) and Vss1 (0 volts), respectively.

If a logic one is loaded into CRAM cell 20 of FIG. 10, node A is taken to −0.2 volts and node B is taken to 1.4 volts. Transistors T1 and T4 are turned on and transistors T2 and T3 are turned off. This maintains Vccpg and Vsspg at Vcc2 (1.4 volts) and Vss2 (−0.2 volts), respectively.

CRAM cells 20 do not actively switch during normal operation (i.e., after cells 20 have been loaded with configuration data). As a result, the current draw on power supply lines 148 and 150 of FIG. 10 is relatively small. This allows charge pumps to be used in producing the power supply voltage Vcc1 and Vcc2 and Vss2. An advantage of using a charge-pump-based architecture of the type shown in FIG. 10 is that charge pumps can be implemented using relatively small amounts of on-chip real estate.

Figure 12:
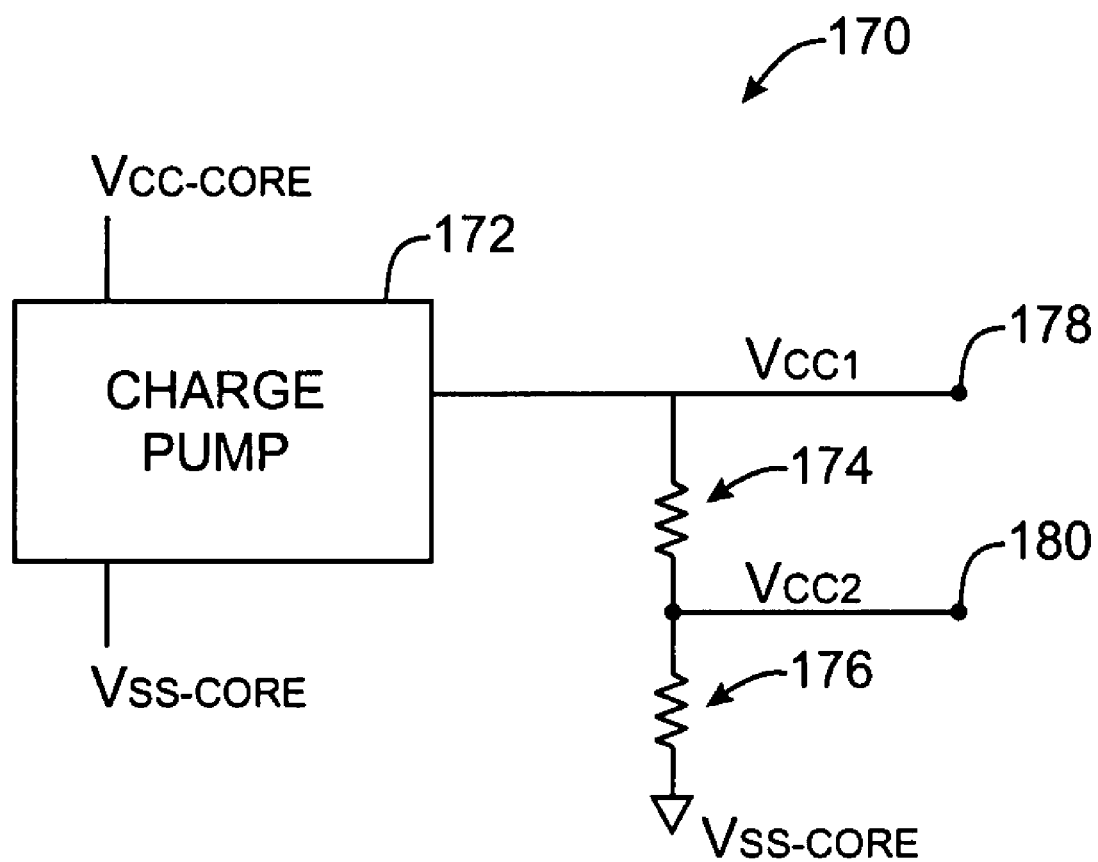
FIG. 12 is an illustrative voltage divider circuit arrangement that may be used to produce multiple positive power supply voltages for an adjustable configuration random-access-memory cell power supply in accordance with the present invention.

If desired, a single charge pump may be used to produce multiple power supply voltages. As an example, in the circuit 170 of FIG. 12, a single charge pump 172 is used to produce a voltage Vcc1 (e.g., 1.6 volts) from core voltages Vcc-core (e.g., 1.2 volts) and Vss-core (e.g., 0 volts). A voltage divider formed from resistors 174 and 176 reduces the voltage Vccpg at node 178 to the voltage Vcc2 at node 180.

Figure 13:
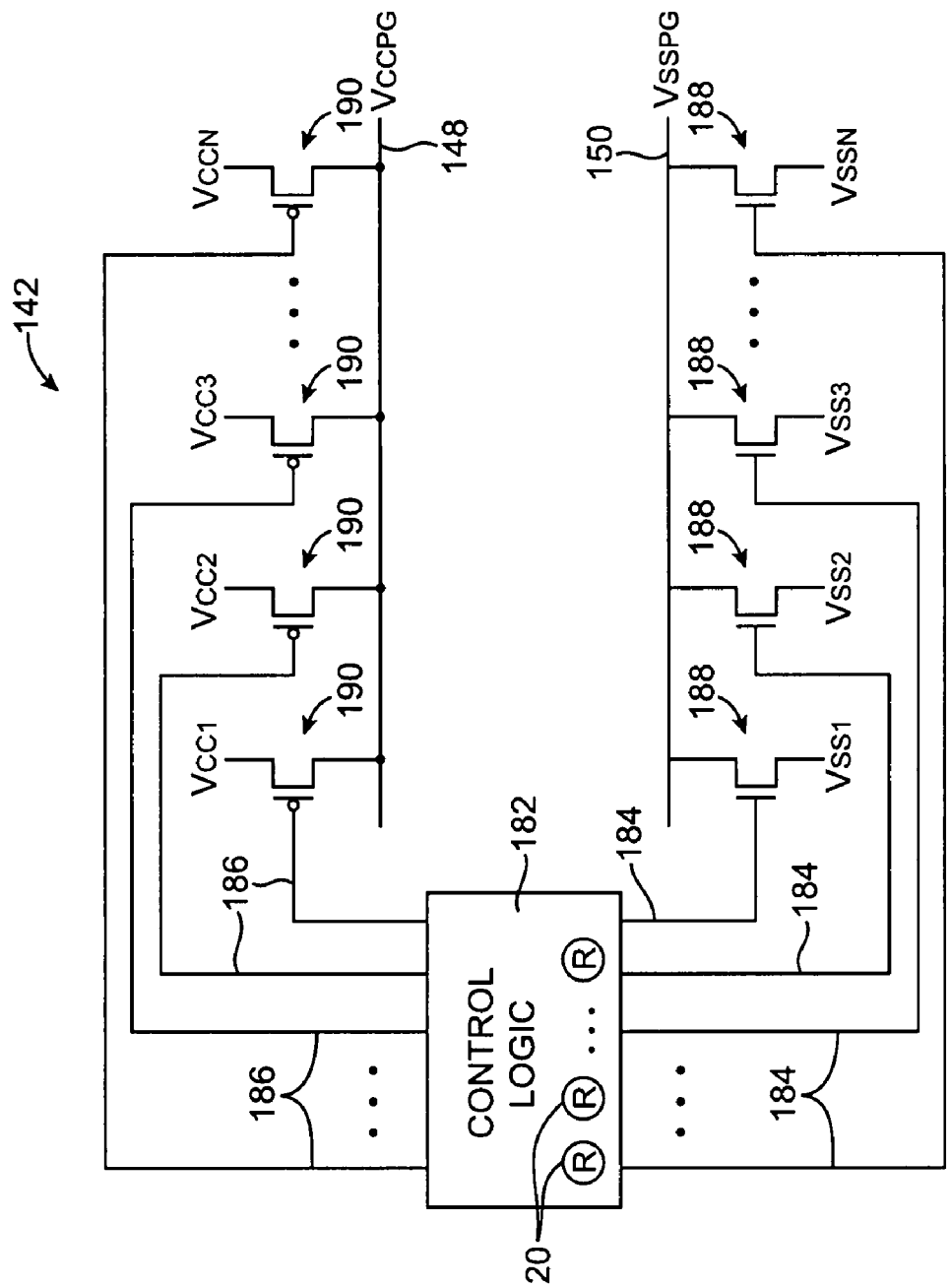
FIG. 13 is a diagram of an illustrative adjustable configuration random-access-memory cell power supply having more than two power supply settings in accordance with the present invention.

FIG. 13 shows an illustrative adjustable CRAM power supply 142 having more than two adjustable power supply settings. In the example of FIG. 13, power supply 142 may be placed in one of N different operating modes. In general, the number N may be any suitable number (e.g., 2, 3, 4, 5, . . . ). Control logic 182 contains multiple CRAM cells 20. The number of CRAM cells 20 that are contained in control logic 182 can be minimized, if desired, by using decoder circuitry in control logic 182. With this type of arrangement, three CRAM cells 20 in logic 182 may be used to produce eight (23) different power supply settings.

Control logic 182 produces control signals on lines 184 and 186. The signals on lines 184 selectively turn off all but one of transistors 188 and thereby select the desired voltage level for Vsspg on line 150. The signals on lines 186 turn off all but one of the transistors 190 and thereby select the desired voltage level Vccpg on line 148. P-channel transistors are preferred for transistors 190 to avoid inserting a threshold voltage drop in the voltage supply path. If desired, control logic 182 may include level-shifting logic so that n-channel transistors may be used for transistors 190.

Figure 14:
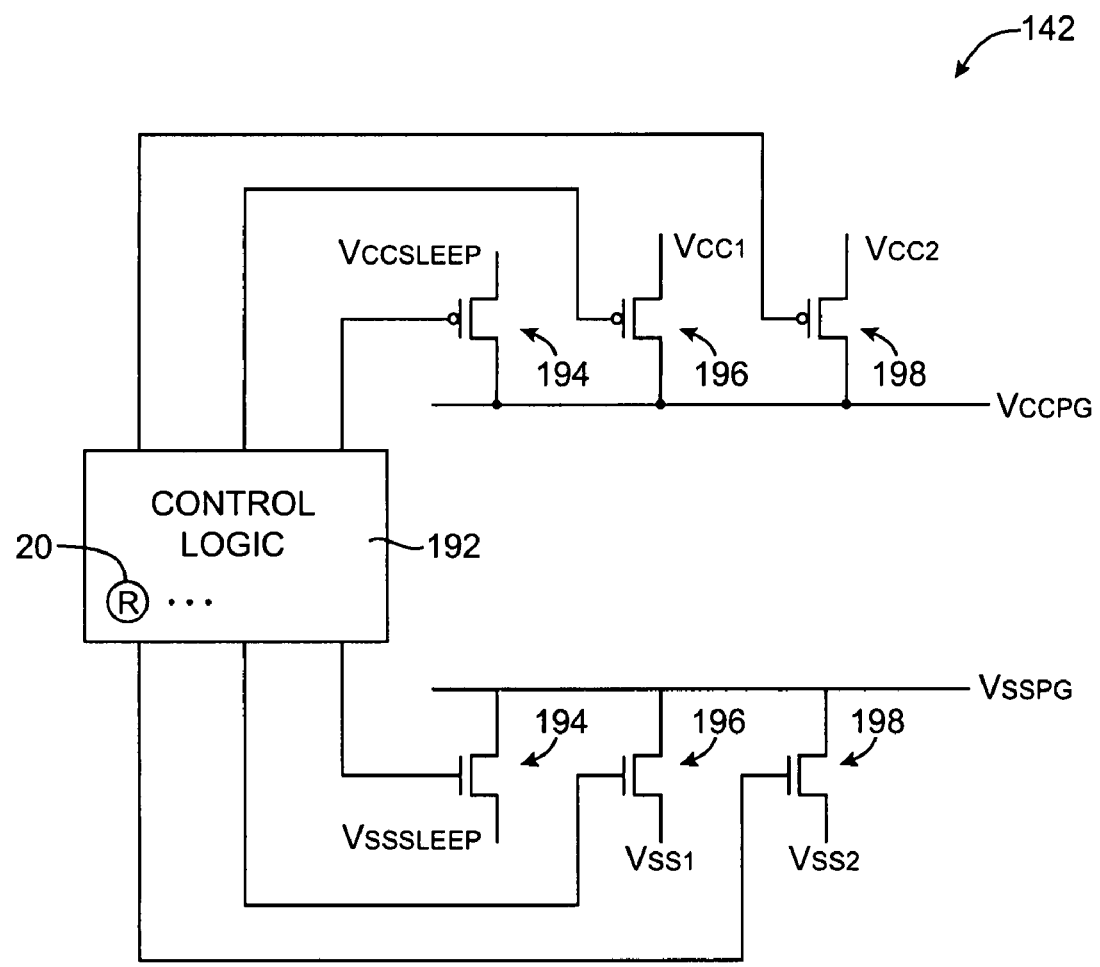
FIG. 14 is a diagram of an illustrative adjustable configuration random-access-memory cell power supply having two regular power supply settings and a sleep mode power supply setting in accordance with the present invention.

If desired, some of the circuitry on device 10 may be placed in a very low power state. This type of situation is typically referred to as "sleep mode," because the affected circuitry is inactive. A region of circuitry may be placed in sleep mode by using a CRAM power supply setting that produces particularly low values of Vccpg and Vsspg. An illustrative adjustable CRAM power supply 142 that supports sleep mode operations is shown in FIG. 14. As shown in FIG. 14, adjustable CRAM power supply 142 has control logic 192 that contains CRAM cells 20 (e.g., two cells 20). The CRAM cells 20 may be loaded with configuration data to adjust the power supply voltages produced by supply 142 between one of three settings.

The power supply 142 shown in the example of FIG. 14 supports a sleep mode and two normal operating modes (fast and slow). When placed in sleep mode, control logic 192 turns transistors 194 on and turns transistors 196 and 198 off. This takes power supply rails Vccpg and Vsspg to the sleep mode voltages of Vccsleep and Vsssleep, respectively. With one suitable arrangement, the value of Vccsleep is 0.8 volts and the value of Vsssleep is −0.5 volts. The voltages Vccsleep and Vsssleep may be produced using charge-pump circuits of the type shown in FIGS. 10 and 12. When placed in the high power (fast) operating mode, control logic 192 turns on transistors 196 and turns off transistors 194 and 198, which takes Vccpg to Vcc1 and takes Vsspg to Vss1. The values of Vccpg and Vsspg may be set at Vcc2 and Vss2 (slow mode) by loading configuration data into memory elements 20 in control logic 192 to direct control logic 192 to turn on transistors 198 and to turn off transistors 194 and 196.

Circuit blocks in different locations on device 10 may be set to operate in different operating modes (e.g., fast, slow) by adjusting groups of associated CRAM cells 20 through their associated CRAM power supply lines 148 and 150. Any suitable architecture may be used to distribute different CRAM power supply voltages to different groups of CRAM cells 20.

Figure 15:
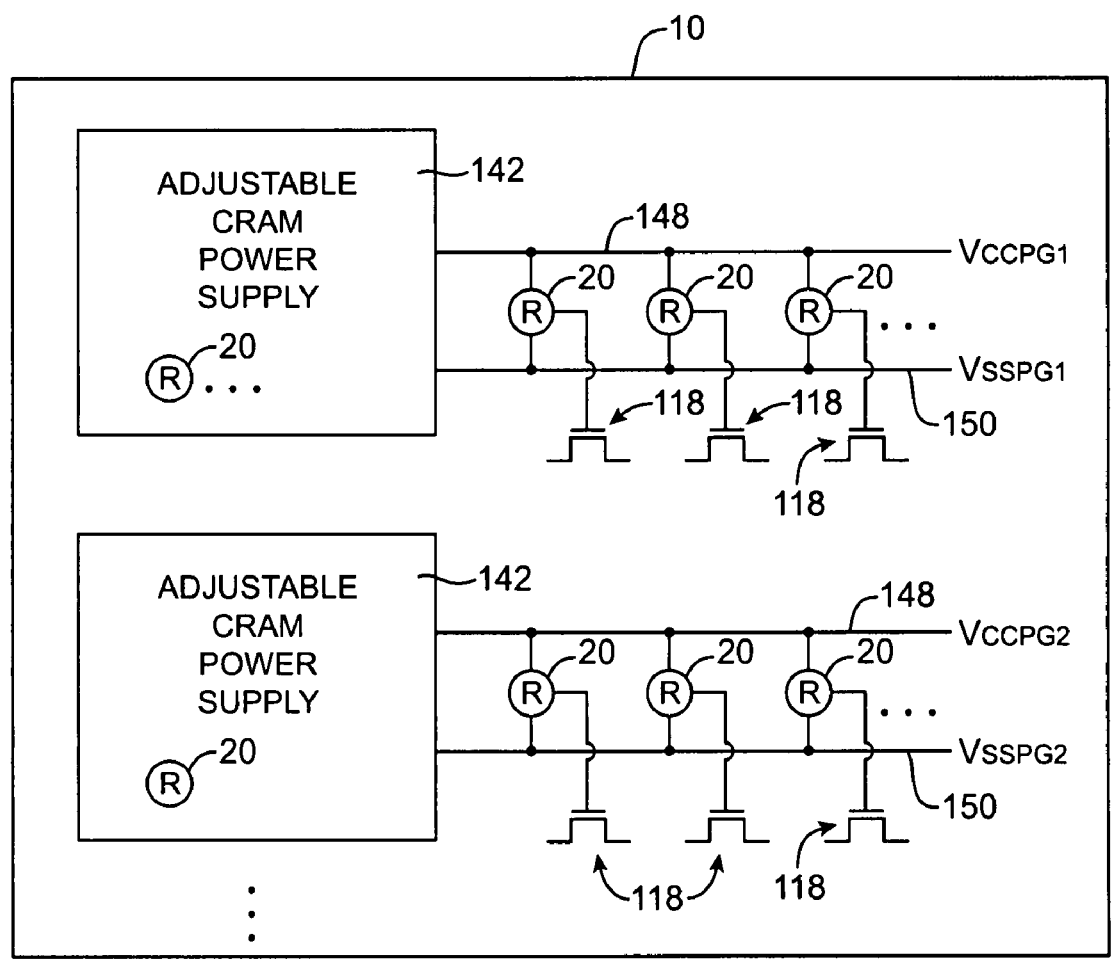
FIG. 15 is a diagram of an illustrative adjustable configuration random-access-memory cell power supply circuit in which different adjustable power supplies are used to produce different power supply settings for powering different associated sets of memory elements in accordance with the present invention.

With one suitable approach, each group of CRAM cells 20 has its own associated adjustable CRAM power supply 142, as shown in FIG. 15. Each adjustable CRAM power supply may be adjusted independently. Each CRAM power supply 142 has an associated set of paths 148 and 150. Paths 148 and 150 convey power to an associated set of CRAM cells 20. This allows one set of CRAM cells 20 to be powered with power supply voltages Vccpg1 and Vsspg1, whereas another set of CRAM cells are powered using Vccpg2 and Vsspg2. There may be 2-10, 10s, 100s, or 1000s of different adjustable CRAM power supplies 142 on a given programmable logic device integrated circuit.

Figure 16:
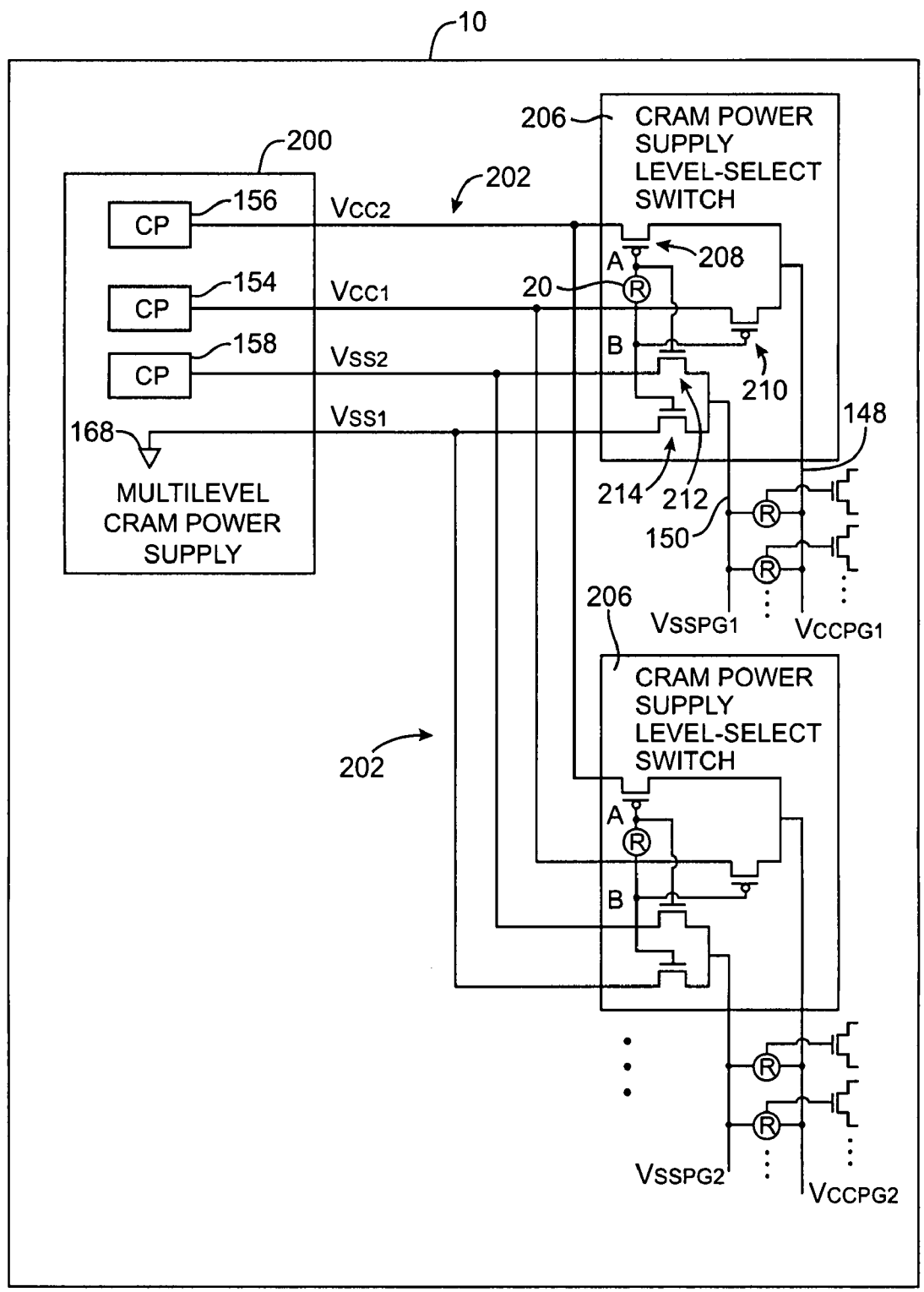
FIG. 16 is a diagram of an illustrative adjustable configuration random-access-memory cell power supply circuit having a single multi-level power supply and multiple power supply level-select switches each of which is used in selecting a power supply level for powering a different associated set of memory elements in accordance with the present invention.

Another suitable approach is shown in FIG. 16. With the power supply circuitry of FIG. 16, a single multilevel CRAM power supply 200 may be used to supply multiple positive CRAM power supply voltages (e.g., voltages Vcc1 and Vcc2) and multiple ground CRAM power supply voltages (e.g., voltages Vss1 and Vss2). Power supply 200 may use any suitable circuitry for generating voltages Vcc1, Vcc2, Vss1 and Vss2 such as the charge pump circuits of FIGS. 10 and 12. Buses such as buses 202 may be used to distribute the positive and ground power supply voltages to multiple CRAM power supply level select switches 206. Switches 206 contain CRAM cells 20 (and, if more than two settings are involved, control logic of the type described in connection with FIGS. 13 and 14). Each switch 206 contains transistors such as transistors 208, 210, 212, and 214 that are controlled in the same way that transistors T1, T2, T3, and T4 of FIG. 10 are controlled. Each switch 206 can be programmed independently, so that its associated paths 148 and 150 receive desired Vccpg and Vsspg levels.

If desired, there may be one or more multilevel CRAM power supplies 200 on a given programmable logic device 10. Any suitable number of switches 206 may be associated with each supply 200. Sleep mode operations may be supported as described in connection with FIG. 14. More than two operating modes may be supported. For example, a three-operating-mode arrangement may be used in which multilevel CRAM power supply 200 supplies three different positive power supply voltages and three different corresponding ground power supply voltages. The switches 206 select respective pairs of the positive and ground voltages according to three different operating mode settings.

Regardless of the particular arrangement used for the adjustable CRAM power supply circuitry, the separation between the positive and ground supply voltages during normal modes of operation (i.e., the separation between Vcc1 and Vss1, the separation between Vcc2 and Vss2, the separation between Vcc3 and Vss3, etc.) is preferably fixed, so that each operating mode can benefit from a maximum Vgs range and therefore a maximum on/off current ratio when controlling its pass transistors.

Transistors such as pass transistor 118 are four terminal devices. Each transistor has a gate G, a source S, and a drain D. Each transistor also has a body terminal B (sometimes called the substrate or bulk terminal). The voltage applied to the body terminals of transistors 118 affects performance. If desired, each transistors 118 may have its body terminal B connected to ground. This type of arrangement may be suitable in many applications. Another suitable arrangement, which may be preferred in many cases, involves connecting the body terminal B of each transistor 118 to Vsspg. If desired, a combination of these approaches may be used on a single programmable logic device.

Illustrative pass transistors 118 under various body bias and CRAM power supply conditions are shown in FIGS. 17-24.

Figure 17:
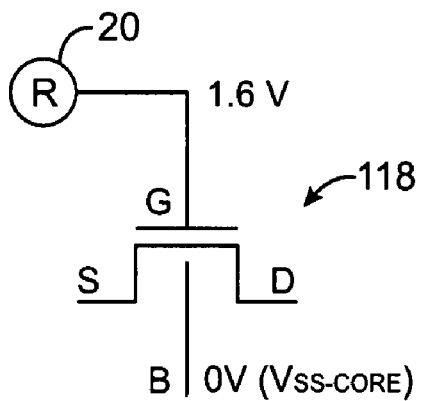
FIGS. 17 and 18 show voltages that may be applied to a pass transistor when the pass transistor has a grounded substrate and is controlled by a configuration random-access-memory cell that is powered using a fast mode power supply setting in accordance with the present invention.
Figure 18:
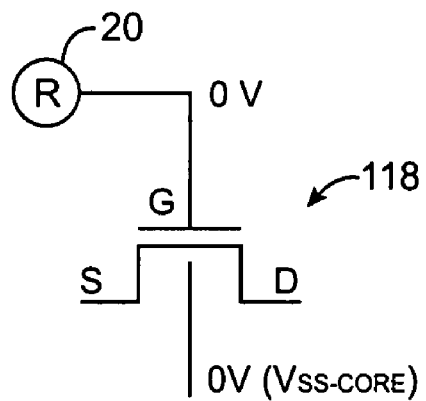
Figure 19:
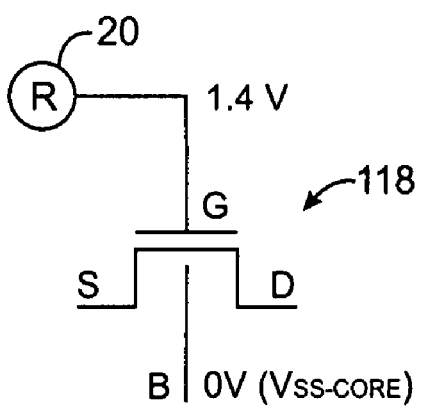
FIGS. 19 and 20 show voltages that may be applied to a pass transistor when the pass transistor has a grounded substrate and is controlled by a configuration random-access-memory cell that is powered using a slow mode power supply setting in accordance with the present invention.
Figure 20:
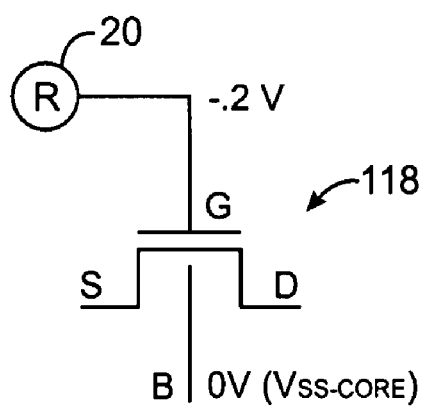
Figure 21:
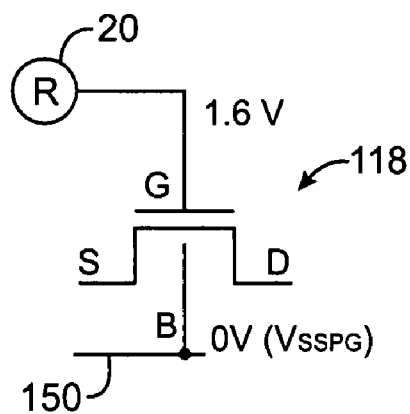
FIGS. 21 and 22 show voltages that may be applied to a pass transistor when the pass transistor has a substrate connected to an adjustable configuration memory cell power supply ground terminal and is controlled by a configuration random-access-memory cell that is powered using a fast mode power supply setting in accordance with the present invention.
Figure 22:
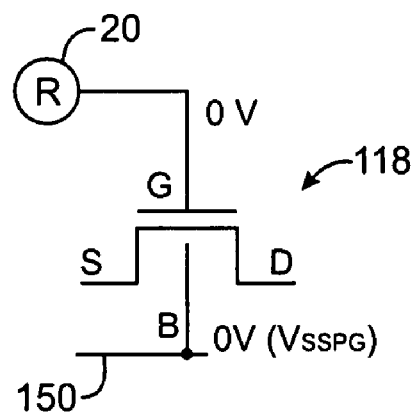
Figure 23:
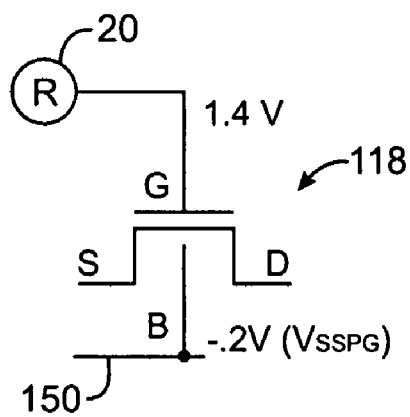
FIGS. 23 and 24 show voltages that may be applied to a pass transistor when the pass transistor has a substrate connected to an adjustable configuration memory cell power supply ground terminal and is controlled by a configuration random-access-memory cell that is powered using a slow mode power supply setting in accordance with the present invention.

In the example of FIGS. 17, 18, 19, and 20, the body terminal B of transistor 118 is connected to a source of ground potential at 0 volts (e.g., Vss-core). FIGS. 17 and 18 show the voltages that may be applied to pass transistor 118 when the CRAM power supply for an associated CRAM cell 20 has been placed in fast mode. In FIG. 17, the CRAM cell 20 that controls transistor 118 has been loaded with a logic one and is applying a Vccpg value of 1.6 volts to the gate of transistor 118. In FIG. 18, the CRAM cell 20 contains a zero and Vccpg is 0 volts. FIGS. 19 and 20 depict the situation when the CRAM power supply has been placed in slow mode. In FIG. 19, the gate voltage on transistor 118 is 1.4 volts. In FIG. 20, the gate voltage on transistor 118 is at −0.2 volts.

Figure 24:
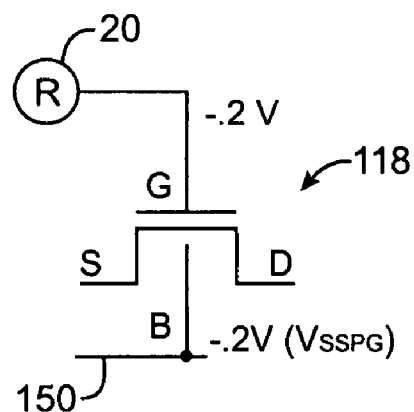

In the example of FIGS. 21, 22, 23, and 24, the body terminal B of transistor 118 is connected to the same path 150 that is used to supply Vsspg to its associated CRAM cell 20. As a result, during fast mode operations (FIGS. 21 and 22), the body voltage B is 0 volts, as in FIGS. 17 and 18. The performance of fast mode transistors 118 is therefore unaffected by the use of Vsspg to bias body terminal B. However, during slow mode operations (FIGS. 23 and 24), the value of Vsspg is less than 0 volts and therefore differs from the slow mode situation of FIGS. 19 and 20. When the CRAM cell 20 contains a logic zero and produces an output signal of −0.2 volts, as shown in FIG. 24, the use of the body bias B that is less than Vss-core will increase the threshold voltage Vt of transistor 118 and will therefore reduce leakage current and power consumption. The connection of body terminal B to Vsspg therefore improves power consumption performance in the FIG. 24 situation. During the situation depicted in FIG. 23, there is a slight performance reduction for transistor 118 that is associated with the increased value of Vt, but this slight performance reduction is often acceptable in view of the power consumption benefits of FIG. 24.

Figure 25:
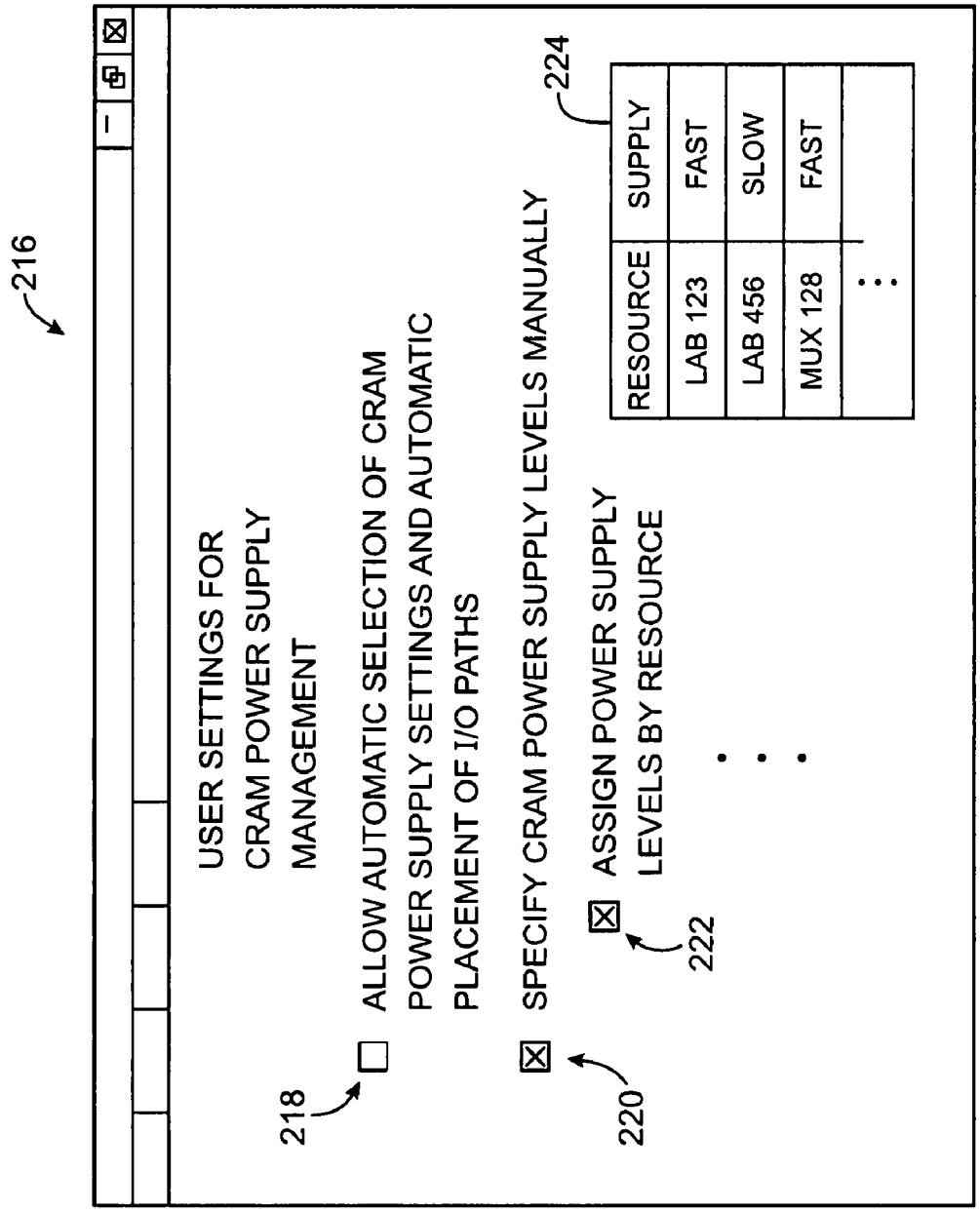
FIG. 25 is an illustrative settings screen that a logic design tool can provide to a user to allow adjustment of configuration random-access-memory power supply settings for the tool in accordance with the present invention.

An illustrative settings screen 216 that may be presented to a logic designer by CAD tools 62 is shown in FIG. 25. The on-screen options of screen 216 may be used to adjust settings related to minimizing power consumption through appropriate CRAM power supply adjustments. The arrangement of FIG. 25 is merely illustrative. Any suitable arrangement may be used to obtain settings information from the logic designer (e.g., using tools 64 of FIG. 4). Moreover, default settings can be used in place of user-adjustable settings if desired.

In the illustrative arrangement of FIG. 25, option 218 may be used to choose whether or not to allow the CAD tools 62 to automatically attempt to minimize power consumption. If option 218 is selected (by clicking on the associated box), the tools 62 will evaluate circuit implementations that involve various different CRAM power supply settings and will identify a circuit implementation that satisfies the logic designer's timing constraints and other design constraints while placing as many regions of circuitry in slow (low-power mode) as possible to reduce overall power consumption.

If option 220 is selected, CAD tools 62 will limit the recommended CRAM power supply settings based on manual user input. Option 222 may be selected if the user desires to make manual resource assignments using table 224. The first column of table 224 contains resource identifiers. The second column of table 224 contains the desired adjustable CRAM power supply settings to be used for the resources. In the example of FIG. 25, the logic designer has manually specified that the CRAM cells 20 associated with logic array block 123 should be powered using the "fast mode" CRAM power supply setting (e.g., voltages 1.6 volts and 0 volts).

Figure 26:
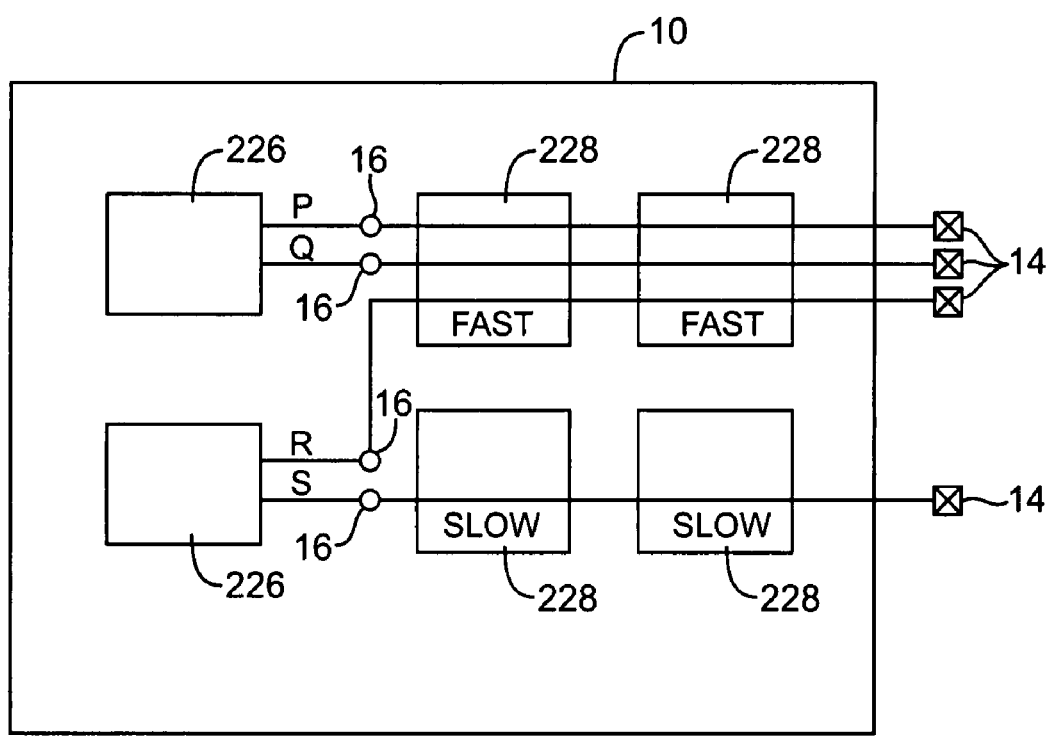
FIG. 26 is a diagram showing how resources and interconnect pathways can be assigned to allow power consumption to be minimized in a programmable logic device integrated circuit while satisfying design constraints in accordance with the present invention.

A programmable logic device 10 of the type that may be configured using CAD tools 62 is shown in FIG. 26. The example of FIG. 26 illustrates how CAD tools 62 allocate resources and make placement decisions to optimize pass transistor power consumption while satisfying design constraints. In the example of FIG. 26, core logic 226 has produced four output signals labeled P, Q, R, and S. There are four regions of circuitry 228 through which signals P, Q, R, and S must pass before being supplied as output signals on pins 14. Circuitry regions 228 may be multiplexers, logic array blocks, or any other suitable circuit component or region of circuitry on device 10.

Signals from core logic 226 pass to circuit regions 228 via programmable interconnects 16. The pattern of programmable interconnects 16 is dictated by the configuration data loaded into interconnect region programmable elements 20 (FIG. 1).

Circuit regions 228 contain CRAM cells 20 and associated pass transistors 118. Based on user settings and/or automatic analysis, the CAD tools 62 determine that the circuit regions 228 that are labeled "fast" are to use CRAM power supply voltages Vccpg and Vsspg of 1.6 volts and 0 volts, respectively. The circuit regions 228 that are labeled "slow" are to use reduced CRAM power voltages of 1.4 volts and −0.2 volts, thereby reducing pass transistor power consumption due to leakage currents.

CAD tools 62 allocate resources and make placement and routing decisions that ensure that the logic designer's design constraints are satisfied. In the example of FIG. 26, three of the four core logic data signals being produced (signals P, Q, and R) are fast signals that have more stringent timing constraints than signal S, which is a slow signal. The pass transistors in the fast circuitry 228 operate with less delay than the pass transistors in the slow circuitry 228. CAD tools 62 ensure that the logic designer's timing constraints and other design constraints are satisfied by routing signals P, Q, and R to the fast circuitry by appropriate programming of interconnects 16. The slow signal S is routed to slow circuitry 228. As this example demonstrates, CAD tools 62 make appropriate resource and interconnect assignments to ensure that the fast signals are handled by the fast circuitry 228, whereas the slow signal S is handled by the slow circuitry 228.

Figure 27:
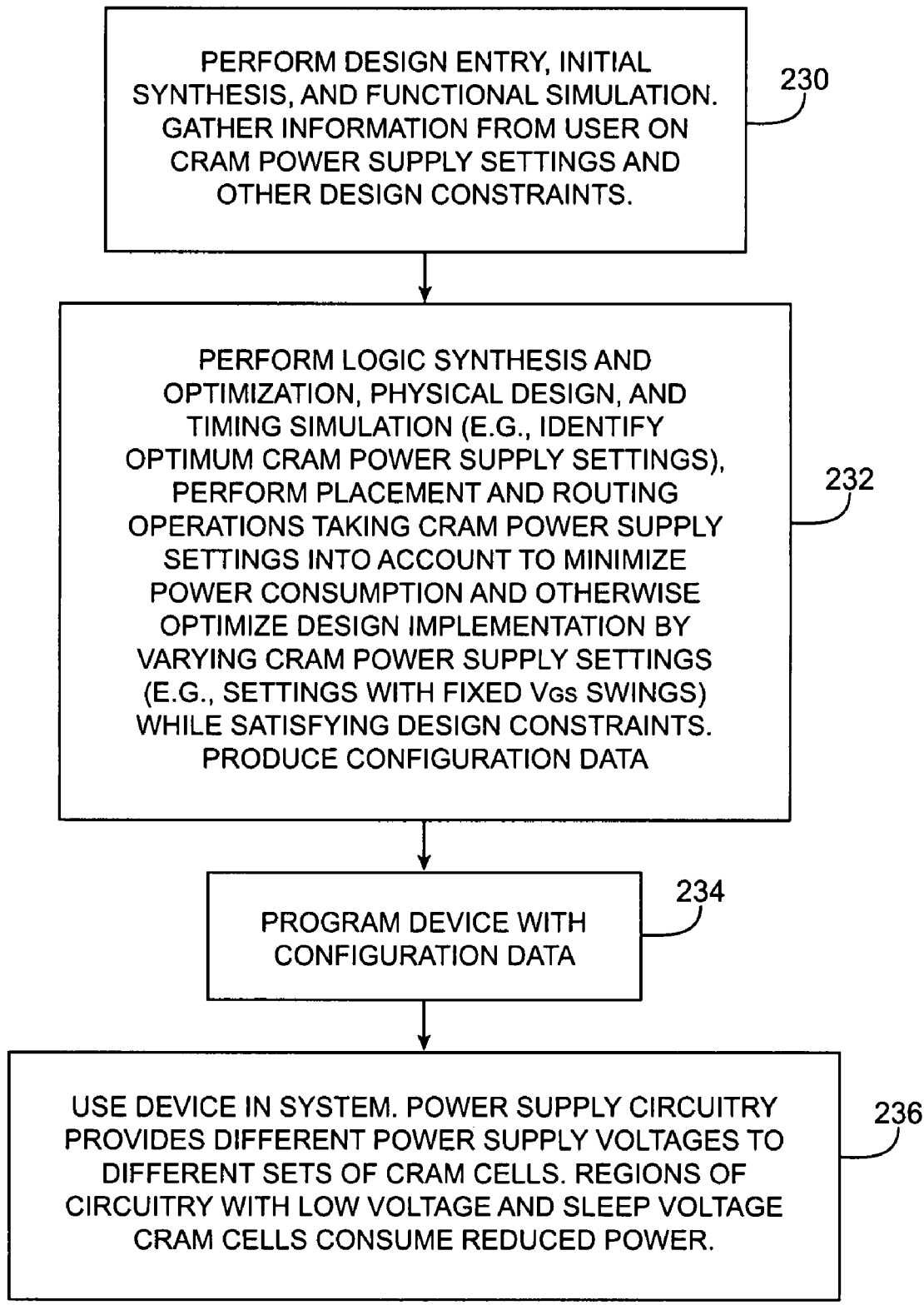
FIG. 27 is a flow chart of illustrative steps involved in using a logic design tool to minimize power consumption by selecting optimum configuration memory element power supply voltages for a circuit design in accordance with the present invention.

Illustrative steps involved in using CAD tools 62 to minimize power consumption when implementing a custom logic design in a programmable logic device integrated circuit containing adjustable CRAM power supply circuitry are shown in FIG. 27.

At step 230, tools such as design and constraint entry tools 64 use input screens to obtain the desired custom logic design from the logic designer. The design includes design constraints such as timing constraints, signal strength constraints, logic function constraints, etc. A settings screen such as screen 216 of FIG. 25 and/or other suitable user input arrangements are used to gather user settings related to identifying one or more appropriate CRAM power supply levels. If desired, some or all settings may be provided as defaults.

During step 230, the user can specify constraints such as delay or speed limits, desired CRAM power supply voltages, current drive limits, noise level limits, core voltage settings, I/O voltage settings, etc. For example, a user may specify a requirement or preference that a particular circuit path operate at a particular minimum speed or maximum delay. If desired, settings such as these may be provided as defaults (e.g., when a user does not specify any such constraints).

At step 232, logic synthesis and optimization, physical design, and timing simulation operations may be performed using tools 72, 74, 76, and 78. During these operations, the CAD tools 62 process the design constraints and CRAM power supply level settings obtained at step 230 and produce a design implementation for the programmable logic device integrated circuit. In particular, based on the user-supplied settings gathered using screen 216 of FIG. 25, the CAD tools identify CRAM power supply voltages (Vccpg and Vsspg values) to be used in powering the CRAM cells 20 on device 10 when the device is used in a system of the type described in connection with FIG. 2. The CAD tools allocate resources and perform placement operations that ensure that the implementation of the desired custom logic circuit satisfies design constraints. Some regions of the circuitry on device 10 may be placed in sleep mode, some may be place in a "fast" operating mode, some may be placed in a "slow" operating mode, etc.

During step 232, the CAD tools produce corresponding configuration data for programming the programmable logic device. Device resources are allocated so that components that are most able to handle slow circuit region performance degradations associated with lowered CRAM power supply voltages are powered using the lowered CRAM power supply settings. Components that require higher levels of performance are powered using higher CRAM power supply settings. This allows CAD tools 62 to minimize pass transistor power consumption without violating design constraints.

The programmable logic device 10 may be programmed with the configuration data produced during step 232 at step 234. Some of the configuration data produces control signals that control transistors in the adjustable CRAM power supplies on the device. Other configuration data bits are loaded into the CRAM cells that are powered by the adjustable CRAM power supplies and which produce output signals to control associated pass transistors 118.

At step 236, the device that has been programmed may be use in a system of the type described in connection with FIG. 2.

The foregoing is merely illustrative of the principles of this invention and various modifications can be made by those skilled in the art without departing from the scope and spirit of the invention.

What is claimed is:

1. A programmable logic device comprising:
   first and second sets of configuration-random-access-memory cells;
   adjustable configuration random-access-memory power supply circuitry containing a plurality of configuration random-access-memory cells; and
   a plurality of power distribution paths that convey positive and ground power supply voltages from the adjustable configuration random-access-memory power supply circuitry to the first and second sets of configuration random-access-memory cells, wherein the positive and ground power supply voltages conveyed to the first set of configuration random-access-memory cells are different than the positive and ground power supply voltages conveyed to the second set of configuration random-access-memory cells.

2. The programmable logic device defined in claim 1 wherein the adjustable configuration random-access-memory power supply circuitry comprises:
   a plurality of positive power supply lines each of which carries a different positive power supply voltage;
   a plurality of ground power supply lines each of which carries a different ground power supply voltage; and
   transistors controlled by the configuration random-access-memory cells in the adjustable configuration random-access-memory power supply circuitry that are connected between the power supply lines and the power distribution paths.

3. The programmable logic device defined in claim 1 wherein the adjustable configuration random-access-memory power supply circuitry comprises:
   a plurality of positive power supply lines each of which carries a different positive power supply voltage;
   charge pump circuitry that produces at least one of the different positive power supply voltages for at least one of the positive power supply lines;
   a plurality of ground power supply lines each of which carries a different ground power supply voltage; and
   transistors controlled by the configuration random-access-memory cells in the adjustable configuration random-access-memory power supply circuitry that are connected between the power supply lines and the power distribution paths.

4. The programmable logic device defined in claim 1 wherein the adjustable configuration random-access-memory power supply circuitry comprises:
   a plurality of positive power supply lines each of which carries a different positive power supply voltage;
   a plurality of charge pumps each of which provides a respective one of the different positive power supply voltages to a respective one of the positive power supply lines;
   a plurality of ground power supply lines each of which carries a different ground power supply voltage; and
   transistors controlled by the configuration random-access-memory cells in the adjustable configuration random-access-memory power supply circuitry that are connected between the power supply lines and the power distribution paths.

5. The programmable logic device defined in claim 1 wherein the adjustable configuration random-access-memory power supply circuitry comprises:
   a plurality of positive power supply lines each of which carries a different positive power supply voltage;
   a positive-voltage charge pump that provides one of the different positive power supply voltages to one of the positive power supply lines;
   a voltage divider that receives the positive power supply voltage produced by the positive-voltage charge pump and that provides another of the different positive power supply voltages to another of the positive power supply lines;
   a plurality of ground power supply lines each of which carries a different ground power supply voltage; and
   transistors controlled by the configuration random-access-memory cells in the adjustable configuration randomaccess-memory power supply circuitry that are connected between the power supply lines and the power distribution paths.

6. The programmable logic device defined in claim 1 wherein the adjustable configuration random-access-memory power supply circuitry comprises:
   a plurality of positive power supply lines each of which carries a different positive power supply voltage;
   a plurality of charge pumps each of which provides a respective one of the different positive power supply voltages to a respective one of the positive power supply lines;
   a plurality of ground power supply lines each of which carries a different ground power supply voltage;
   an additional charge pump that provides one of the different ground power supply voltages to an associated one of the ground power supply lines; and
   transistors controlled by the configuration random-access-memory cells in the adjustable configuration random-access-memory power supply circuitry that are connected between the power supply lines and the power distribution paths, wherein the transistors controlled by the first set of configuration random-access-memory cells each have a body terminal that is supplied with the ground power supply voltage conveyed to the first set of configuration random-access-memory cells, and wherein the transistors that are controlled by the second set of configuration random-access-memory cells each have a body terminal that is supplied with the ground power supply voltage conveyed to the second set of configuration random-access-memory cells.

7. The programmable logic device defined in claim 1 wherein the plurality of configuration random-access-memory cells in the adjustable configuration random-access-memory power supply circuitry comprise first and second configuration random-access-memory cells, wherein the power distribution paths that convey the positive and ground power supply voltages to the first and second sets of configuration random-access-memory cells comprise a first positive power supply distribution path and a first ground power supply distribution path that convey power to the first set of configuration random-access-memory cells and a second positive power supply distribution path and a second ground power supply distribution path that convey power to the second set of configuration random-access-memory cells, and wherein the adjustable configuration random-access-memory power supply circuitry comprises:
   a first pair of transistors controlled by the first configuration random-access-memory cell, wherein one of the first pair of transistors is connected to the first positive power supply distribution path and selectively provides a first positive power supply voltage to the first positive power supply distribution path and wherein another of the first pair of transistors is connected to the first ground power supply distribution path and selectively provides a first ground power supply voltage to the first ground power supply distribution path;
   a second pair of transistors controlled by the first configuration random-access-memory cell, wherein one of the second pair of transistors is connected to the first positive power supply distribution path and selectively provides a second positive power supply voltage to the first positive power supply distribution path, wherein the second positive power supply voltage is different than the first positive power supply voltage, wherein another of the second pair of transistors is connected to the first ground power supply distribution path and selectively provides a second ground power supply voltage to the first ground power supply distribution path, and wherein the second ground power supply voltage is different than the first ground power supply voltage;
   a third pair of transistors controlled by the second configuration random-access-memory cell, wherein one of the third pair of transistors is connected to the second positive power supply distribution path and selectively provides the first positive power supply voltage to the second positive power supply distribution path and wherein another of the third pair of transistors is connected to the second ground power supply distribution path and selectively provides the first ground power supply voltage to the second ground power supply distribution path; and
   a fourth pair of transistors controlled by the second configuration random-access-memory cell, wherein one of the fourth pair of transistors is connected to the second positive power supply distribution path and selectively provides the second positive power supply voltage to the second positive power supply distribution path and wherein another of the fourth pair of transistors is connected to the second ground power supply distribution path and selectively provides the second ground power supply voltage to the second ground power supply distribution path.

8. The programmable logic device defined in claim 7 further comprising:
   a first charge pump that provides the first positive power supply voltage to the transistor in the first pair of transistors that is connected to the first positive power supply distribution path; and
   a second charge pump that provides the first ground power supply voltage to the transistor in the first pair of transistors that is connected to the first ground power supply distribution path.

9. The programmable logic device defined in claim 7 further comprising:
   a first charge pump that provides the first positive power supply voltage to the transistor in the first pair of transistors that is connected to the first positive power supply distribution path;
   a second charge pump that provides the first ground power supply voltage to the transistor in the first pair of transistors that is connected to the first ground power supply distribution path; and
   a third charge pump that provides the second positive power supply voltage to the transistor in the second pair of transistors that is connected to the first positive power supply distribution path.

10. The programmable logic device defined in claim 7 further comprising:
    a first charge pump that provides the first positive power supply voltage to the transistor in the first pair of transistors that is connected to the first positive power supply distribution path and that provides the first positive power supply voltage to the transistor in the third pair of transistors that is connected to the second positive power supply distribution path; and
    a second charge pump that provides the first ground power supply voltage to the transistor in the first pair of transistors that is connected to the first ground power supply distribution path and that provides the first ground power supply voltage to the transistor in the third pair of transistors that is connected to the second ground power supply distribution path.

11. The programmable logic device defined in claim 7 further comprising:

a first charge pump that provides the first positive power supply voltage to the transistor in the first pair of transistors that is connected to the first positive power supply distribution path and that provides the first positive power supply voltage to the transistor in the third pair of transistors that is connected to the second positive power supply distribution path;

a second charge pump that provides the first ground power supply voltage to the transistor in the first pair of transistors that is connected to the first ground power supply distribution path and that provides the first ground power supply voltage to the transistor in the third pair of transistors that is connected to the second ground power supply distribution path; and a third charge pump that provides the second positive power supply voltage to the transistor in the second pair of transistors that is connected to the first positive power supply distribution path and that provides the second positive power supply voltage to the transistor in the fourth pair of transistors that is connected to the second positive power supply distribution path.

12. The programmable logic device defined in claim 7 further comprising:

a first charge pump that provides the first positive power supply voltage to the transistor in the first pair of transistors that is connected to the first positive power supply distribution path; and a second charge pump that provides the first ground power supply voltage to the transistor in the first pair of transistors that is connected to the first ground power supply distribution path;

a third charge pump that provides the first positive power supply voltage to the transistor in the third pair of transistors that is connected to the second positive power supply distribution path; and a fourth charge pump that provides the first ground power supply voltage to the transistor in the third pair of transistors that is connected to the second ground power supply distribution path.

13. The programmable logic device defined in claim 7 further comprising:

a first charge pump that provides the first positive power supply voltage to the transistor in the first pair of transistors that is connected to the first positive power supply distribution path; and a second charge pump that provides the first ground power supply voltage to the transistor in the first pair of transistors that is connected to the first ground power supply distribution path;

a third charge pump that provides the first positive power supply voltage to the transistor in the third pair of transistors that is connected to the second positive power supply distribution path;

a fourth charge pump that provides the first ground power supply voltage to the transistor in the third pair of transistors that is connected to the second ground power supply distribution path;

a fifth charge pump that provides the second positive power supply voltage to the transistor in the second pair of transistors that is connected to the first positive power supply distribution path; and a sixth charge pump that provides the second positive power supply voltage to the transistor in the fourth pair of transistors that is connected to the second positive power supply distribution path.

14. A method for powering configuration random-access-memory cells on a programmable logic device integrated circuit comprising:

in response to loaded configuration data, using adjustable configuration random-access-memory cell power supply circuitry to supply a first positive power supply voltage and first ground power supply voltage to a first set of configuration random-access-memory cells and to supply a second positive power supply voltage and second ground supply voltage to a second set of configuration random-access-memory cells; and applying output signals from the first and second sets of configuration random-access-memory cells to respective first and second sets of pass transistors.

15. The method defined in claim 14 wherein a voltage difference exists between the first positive power supply voltage and the first ground power supply voltage that is equal to a voltage difference that exists between the second positive power supply voltage and the second ground supply voltage and wherein the adjustable configuration random-access-memory cell power supply circuitry contains configuration random-access-memory cells, the method further comprising loading the configuration data into the configuration random-access-memory cells in the adjustable configuration random-access-memory cell power supply circuitry.

16. The method defined in claim 14 further comprising using a computer-aided design tool to provide a logic designer with an on-screen option for manually adjusting settings for the adjustable configuration random-access-memory cell circuitry.

17. The method defined in claim 14 further comprising using a computer-aided design tool to automatically select the first positive power supply voltage, the first ground power supply voltage, the second positive power supply voltage, and the second ground supply voltage, wherein the first positive power supply voltage and first ground power supply voltage comprise sleep power supply voltages.

18. An integrated circuit comprising:

a plurality of regions of circuitry;

a set of configuration random-access-memory cells in each region of circuitry, wherein the configuration random-access-memory cells are loaded with configuration data and produce corresponding output signals and wherein each configuration random-access-memory cell has a positive power supply terminal and a ground power supply terminal;

pass transistors in each region of circuitry, wherein each pass transistor has a gate that receives a respective one of the output signals; and adjustable configuration random-access-memory power supply circuitry that produces a plurality of different configuration random-access-memory power supply voltages for the plurality of regions of circuitry, wherein the set of configuration random-access-memory cells in a first of the plurality of regions of circuitry is powered using a first positive power supply voltage and a first ground power supply voltage, wherein the set of configuration random-access-memory cells in a second of the plurality of regions of circuitry is powered using a second positive power supply voltage and a second ground power supply voltage, wherein the first positive power supply voltage is different than the second positive power supply voltage and wherein the first ground power supply voltage is different than the second ground power supply voltage.

19. The integrated circuit defined in claim 18 wherein the adjustable configuration random-access-memory power supply circuitry comprises a plurality of configuration random-access-memory cells that are loaded with configuration data to adjust the adjustable configuration random-access-memory power supply circuitry, wherein the first positive power supply voltage and first ground power supply voltage are separated from each other by a given voltage range, and wherein the second positive power supply voltage and second ground power supply voltage are separated from each other by the given voltage range.

20. The integrated circuitry defined in claim 18 wherein the adjustable configuration random-access-memory power supply circuitry comprises:

first and second p-channel metal-oxide-semiconductor transistors coupled to the positive power supply terminals of the configuration random-access-memory cells in the first region of circuitry;

first and second n-channel metal-oxide-semiconductor transistors coupled to the ground power supply terminals of the configuration random-access-memory cells in the first region of circuitry;

third and fourth p-channel metal-oxide-semiconductor transistors coupled to the positive power supply terminals of the configuration random-access-memory cells in the second region of circuitry;

third and fourth n-channel metal-oxide-semiconductor transistors coupled to the ground power supply terminals of the configuration random-access-memory cells in the first region of circuitry; and charge pump circuitry that provides power supply voltages to the first, second, third, and fourth p-channel metal-oxide-semiconductor transistors.

* * * * *